(12) United States Patent
Goto et al.

(10) Patent No.: US 12,471,265 B2
(45) Date of Patent: Nov. 11, 2025

(54) MEMORY DEVICES INCLUDING TRANSISTORS ON MULTIPLE LAYERS

(71) Applicant: Taiwan Semiconductor Manufacturing Company, Ltd., Hsinchu (TW)

(72) Inventors: Ken-Ichi Goto, Hsinchu (TW); Cheng-Yi Wu, Taichung (TW)

(73) Assignee: Taiwan Semiconductor Manufacturing Company, Ltd.

( * ) Notice: Subject to any disclaimer, the term of this patent is extended or adjusted under 35 U.S.C. 154(b) by 650 days.

(21) Appl. No.: 17/743,233

(22) Filed: May 12, 2022

(65) Prior Publication Data

US 2023/0164970 A1    May 25, 2023

Related U.S. Application Data

(60) Provisional application No. 63/281,282, filed on Nov. 19, 2021.

(51) Int. Cl.
| | | |
|---|---|---|
| *H10B 10/00* | (2023.01) | |
| *H01L 23/528* | (2006.01) | |
| *H10D 30/01* | (2025.01) | |
| *H10D 30/67* | (2025.01) | |
| *H10D 84/01* | (2025.01) | |
| *H10D 84/03* | (2025.01) | |

(52) U.S. Cl.
CPC ....... *H10B 10/125* (2023.02); *H01L 23/5283* (2013.01); *H10D 30/031* (2025.01); *H10D 30/6713* (2025.01); *H10D 30/6755* (2025.01); *H10D 84/013* (2025.01); *H10D 84/0158* (2025.01); *H10D 84/038* (2025.01)

(58) Field of Classification Search
CPC .............. H01L 29/7869; H10B 10/125; H10D 64/258; H10D 84/017; H10D 84/0184; H10D 84/0193; H10D 84/038; H10D 84/834; H10D 30/6735; H10D 30/6757
See application file for complete search history.

(56) References Cited

U.S. PATENT DOCUMENTS

| | | |
|---|---|---|
| 2004/0245577 A1 | 12/2004 | Bhattacharyya |
| 2005/0167786 A1 | 8/2005 | Gill et al. |
| 2006/0267100 A1 | 11/2006 | Noguchi et al. |
| 2010/0006912 A1 | 1/2010 | Larsen et al. |

(Continued)

*Primary Examiner* — Britt D Hanley
*Assistant Examiner* — Casey Paul Boatman
(74) *Attorney, Agent, or Firm* — Merchant & Gould P.C.

(57) ABSTRACT

A semiconductor device including a substrate, a first layer over the substrate, and a second layer over the first layer. The first layer including a first fin structure, a first gate structure that overlaps the first fin structure to form a first pass-gate transistor, and a second gate structure that is separate from the first gate structure and that overlaps the first fin structure to form a first pull-down transistor. The second layer including a third gate structure disposed over the second gate structure and connected to the second gate structure, a first semiconductor oxide structure disposed on the third gate structure, and a first drain/source region and a second drain/source region disposed on the first semiconductor oxide structure, wherein the third gate structure, the first semiconductor oxide structure, the first drain/source region, and the second drain/source region constitute a first pull-up transistor.

20 Claims, 18 Drawing Sheets

(56) References Cited

U.S. PATENT DOCUMENTS

| | | | |
|---|---|---|---|
| 2010/0200918 A1 | 8/2010 | Larsen et al. | |
| 2011/0181343 A1* | 7/2011 | Myers | H03K 19/0016 |
| | | | 327/365 |
| 2015/0287745 A1* | 10/2015 | Kato | H01L 27/1225 |
| | | | 257/43 |
| 2018/0166129 A1 | 6/2018 | Mehta et al. | |
| 2018/0308540 A1* | 10/2018 | Liaw | G11C 11/414 |
| 2022/0173099 A1* | 6/2022 | Kim | H10D 30/6755 |

\* cited by examiner

| | 4T2R SRAM |
|---|---|
| Cell Area Poly x fin | 0.014um2 2Px5F |
| Rel Area | 0.66 |
| SNM (Static noise margin) | 230mV |
| Speed (W/R) | W<2ns, R<2ns |
| Ids (PU/PD/PG) | 0:1:1 |

MEMORY DEVICES INCLUDING TRANSISTORS ON MULTIPLE LAYERS

CROSS-REFERENCE TO RELATED APPLICATIONS

This application claims the benefit of U.S. Provisional Application No. 63/281,282, filed Nov. 19, 2021, and titled "MEMORY DEVICES," the disclosure of which is hereby incorporated herein by reference.

BACKGROUND

Memory devices, such as static random-access memory (SRAM) devices, are used in a variety of applications. Example applications include, but are not limited to, computing devices, routers, and peripheral devices such as displays and printers. In the memory devices, memory cells, such as SRAM cells, include multiple transistors in each of the memory cells, such as four transistor (4T) SRAM cells, six transistor (6T) SRAM cells, and eight transistor (8T) SRAM cells. Generally, each SRAM cell includes two cross-coupled inverters that store data and additional transistors that are used to read data from and write data into the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
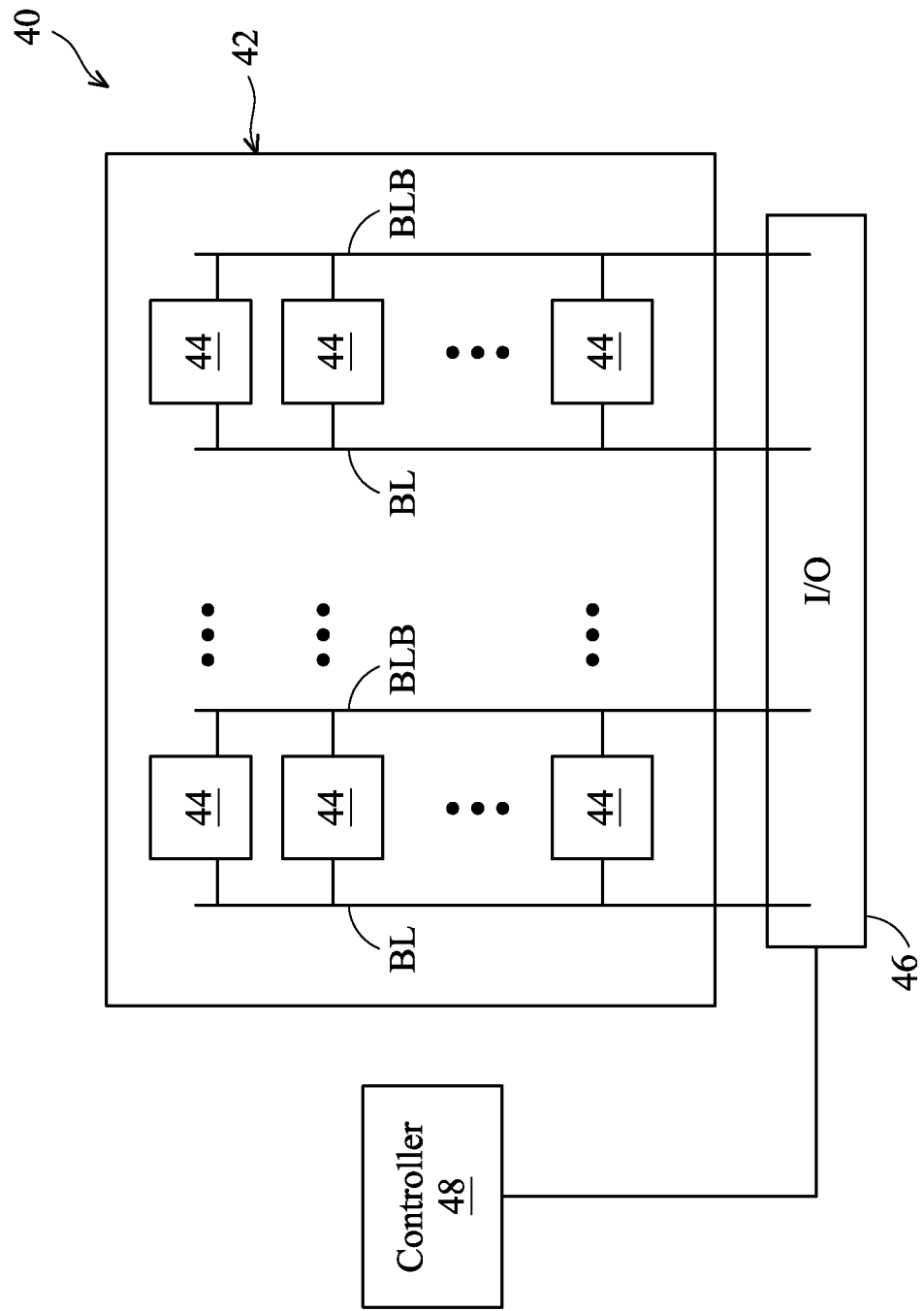
FIG. 1 is a block diagram schematically illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some memory devices, the amount of area consumed by a memory cell can be large. For example, when the memory device includes 6T SRAM cells and all six transistors of each memory cell are formed on one layer, such as the bottom layer, of the memory device, the amount of area consumed by each memory cell is determined by the area consumed by all six transistors.

Disclosed embodiments provide memory devices that include memory cells that have some of the transistors in the memory cells formed on one or more upper layers and some of the transistors formed on one or more lower layers, such as the bottom layer. For example, in some embodiments, two transistors in a 6T SRAM cell are formed on one or more upper layers, such as a metal-2 layer and/or a metal-3 layer, and four transistors are formed on a bottom layer. Thus, the amount of area consumed by the 6T SRAM cell can be reduced from the area consumed by all six transistors on one layer to the area consumed by the four transistors on the bottom layer or the area consumed by the two transistors on the upper layer(s). Also, in some embodiments, the one or more transistors on the upper layer(s) are fabricated in a back-end-of-line (BEOL) process, which reduces the cost of fabricating the memory device and the cost of the memory device. In addition, in some embodiments, the speed of the disclosed memory cells is equal to or substantially equal to the speed of conventional one-layer memory cells.

In some embodiments, two transistors of the cross-coupled inverters, such as the PU transistors, are formed on one or more upper layers and the remaining transistors in the memory cell are formed on a lower layer, such as the bottom layer. In some embodiments, a 6T SRAM cell includes two cross-coupled inverters formed with four transistors, and two access control transistors. The PU transistors of the cross-coupled inverters are formed in an upper layer and the pull-down (PD) transistors of the cross-coupled inverters and the two access control transistors are formed in the lower layer, such as the bottom layer.

In some embodiments, the PU transistors of the cross-coupled inverters are configured as n-type BETr transistors (NMOS BETr transistors) and the PD transistors as p-type transistors (PMOS transistors). In some embodiments, the BETr transistors include indium gallium zinc oxide (IGZO). In some embodiments, the BETr transistors include indium tin oxide (ITO). In other embodiments, other materials can be used, such as other semiconductor oxide materials. The BETr transistors are fabricated in a BEOL process, which often reduces the fabrication costs.

Disclosed embodiments further include four transistors of an SRAM cell formed on one or more upper layers, such as a metal-2 layer and/or a metal-3 layer, and the remaining transistors in the SRAM cell formed on one or more lower layers, such as a bottom layer. In some embodiments, in a 6T SRAM cell, the two PD transistors of the cross-coupled inverters and the two access control transistors are formed in one or more of the upper layers and the two PU transistors of the cross-coupled inverters are formed in one or more lower layers, such as the bottom layer. In some embodiments, the two PD transistors and the two access control transistors are n-type BETr transistors, and the two PU transistors are p-type transistors.

Further disclosed embodiments include a four transistor and two resistor (4T2R) memory cell. In some embodiments, the 4T2R memory cell includes the four transistors and the two resistors formed in the same layer, such as an upper layer or a bottom layer. In some embodiments, the 4T2R memory cell includes the four transistors and the two resistors formed in multiple layers, such as multiple upper layers or multiple lower layers. In some embodiments, the four transistors are n-type BETr transistors, and the two resistors are BETr resistors. In some embodiments, the BETr resistors are part of a BETr plate, where a portion of the BETr plate that does not overlap with a gate of the BETr transistor is a resistor and not a transistor channel. In some embodiments, the BETr material is a ceramic material that has a high resistance. In some embodiments, the BETr material includes IGZO. In some embodiments, the BETr material includes ITO. In some embodiments, the resistance of the BETr plate is in the millions of ohms.

FIG. 1 is a block diagram schematically illustrating a memory device 40, in accordance with some embodiments. The memory device 40 includes a memory array 42 that includes a plurality of memory cells 44 arranged in rows and columns. Each of the rows has a corresponding word line WL (not shown in FIG. 1), and each of the columns has a corresponding bit line BL and a corresponding complementary bit line or bit line bar BLB. Each memory cell 44 of the plurality of memory cells 44 is electrically coupled to the word line WL of the row of the memory cell 44 and to the corresponding bit line BL and the bit line bar BLB of the column of the memory cell 44. The bit lines BLs and the bit line bars BLBs are electrically connected to an input/output (I/O) block 46 that is configured to read data signals from and provide data signals to the plurality of memory cells 44. In some embodiments, each of the plurality of memory cells 44 is an SRAM cell. In some embodiments, each of the plurality of memory cells 44 is a 6T SRAM cell. In some embodiments, each of the plurality of memory cells 44 is an SRAM cell, such as a 4T SRAM cell or an 8T SRAM cell.

The memory device 40 includes a memory control circuit or controller 48 that is electrically connected to the memory array 42 and to the I/O block 46 and configured to control operation of the memory device 40. The controller 48 receives signals such as clock signals, command signals, and address signals for accessing and controlling operation of the memory device 40, including operation of the plurality of memory cells 44 in the memory array 42. For example, address signals are received and decoded into row and column addresses for accessing memory cells 44 of the memory array 42. Also, the controller 48 is configured to control the application of signals to the word lines WLs, the bit lines BLs, the bit line bars BLBs, the I/O block 46, and power supply lines of the memory cells 44 and the memory device 40.

In some embodiments, the controller 48 includes one or more processors. In some embodiments, the controller 48 includes one or more processors and memory configured to store code that is executed by the one or more processors to perform the functions of the memory device 40. In some embodiments, the controller 48 includes hardware, such as logic, configured to receive addresses and commands and perform the functions of the memory device 40. In some embodiments, the controller 48 includes hardware and/or firmware and/or software executed by the hardware for performing the functions of the memory device 40.

Figure 2:
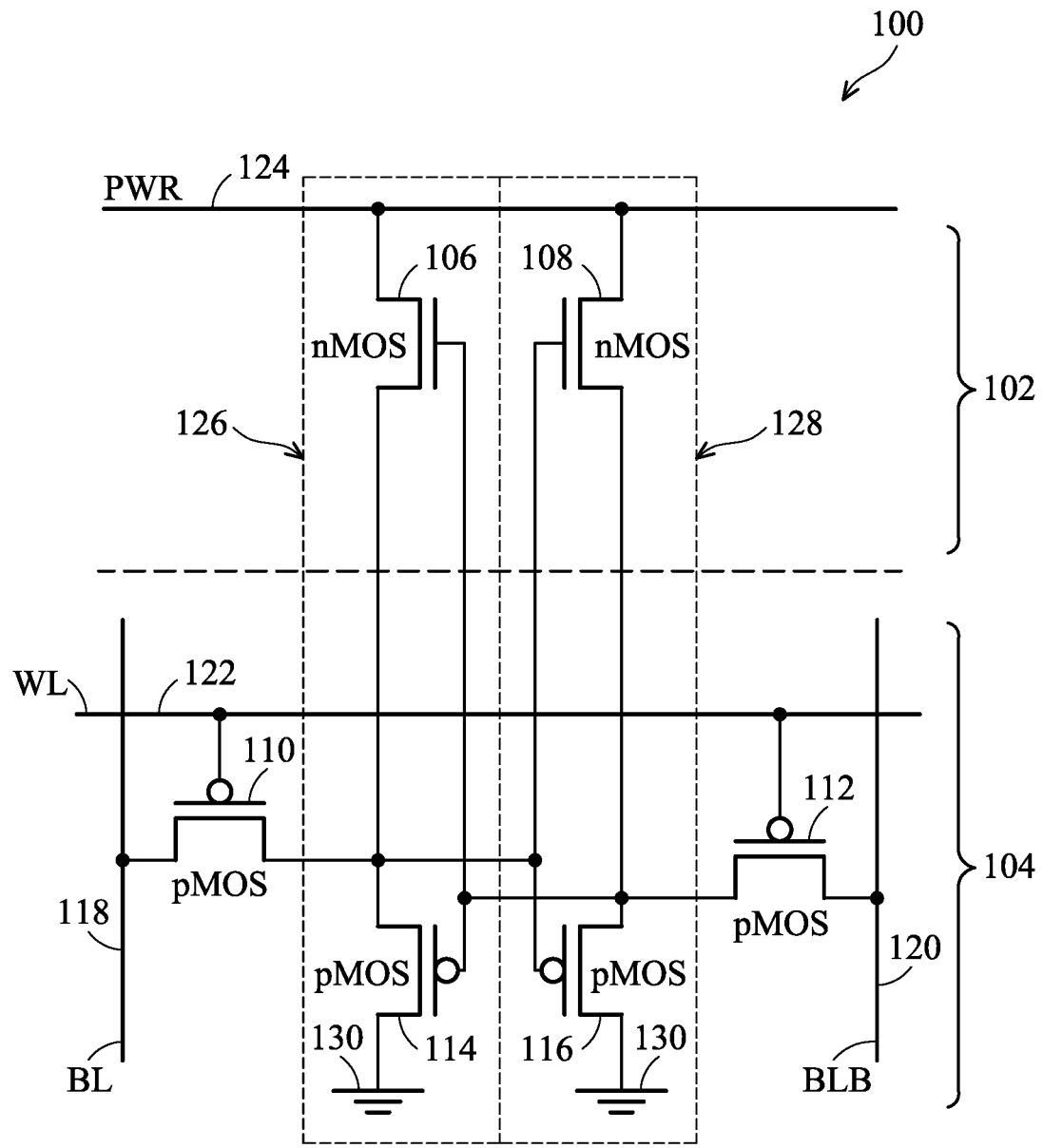
FIG. 2 is a diagram schematically illustrating a 6T SRAM cell, in accordance with some embodiments.

FIG. 2 is a diagram schematically illustrating a 6T SRAM cell 100, in accordance with some embodiments. The 6T SRAM cell 100 includes two transistors formed on one or more upper layers 102, such as a metal-2 layer and/or a metal-3 layer, of the semiconductor device and four transistors formed on one or more lower layers 104, such as a silicon bottom layer, of the semiconductor device. In this example, the 6T SRAM cell 100 includes a first NMOS PU transistor 106 and a second NMOS PU transistor 108 formed on the one or more upper layers 102, and a first PMOS access control transistor 110, a second PMOS access control transistor 112, a first PMOS PD transistor 114, and a second PMOS PD transistor 116 formed on the one or more lower layers 104. The 6T SRAM cell 100 is configured to be used in a memory device, such as the memory device 40 of FIG. 1. In some embodiments, the 6T SRAM cell 100 is like one of the memory cells 44.

The 6T SRAM cell 100 is electrically connected to a bit line BL 118 and a bit line bar BLB 120, like the bit line BL and bit line bar BLB of the memory device 40. Also, the SRAM cell 100 is electrically connected to a word line WL 122, like the word line WL of the memory device 40. In addition, the SRAM cell 100 is electrically connected to receive a power supply voltage PWR 124. In other embodiments, the SRAM cell 100 is a different type of SRAM cell, such as a 4T SRAM cell or an 8T SRAM cell.

The 6T SRAM cell 100 includes the two PMOS access control transistors 110 and 112 and two cross-coupled inverters 126 and 128. The cross-coupled inverters 126 and 128 are configured to store one bit of information and the PMOS access control transistors 110 and 112 are configured to control access to the cross-coupled inverters 126 and 128.

The first cross-coupled inverter 126 includes the first NMOS PU transistor 106 and the first PMOS PD transistor 114. One drain/source region of the first NMOS PU transistor 106 is electrically connected to receive the power supply voltage PWR 124 and the other drain/source region of the first NMOS PU transistor 106 is electrically connected to a drain/source region of the first PMOS PD transistor 114, the gates of the second NMOS PU transistor 108 and the second PMOS PD transistor 116, and to a drain/source region of the first PMOS access control transistor 110. The other drain/source region of the first PMOS PD transistor 114 is electrically connected to a reference 130, such as ground.

The second cross-coupled inverter 128 includes the second NMOS PU transistor 108 and the second PMOS PD transistor 116. One drain/source region of the second NMOS PU transistor 108 is electrically connected to receive the power supply voltage PWR 124 and the other drain/source region of the second NMOS PU transistor 108 is electrically connected to a drain/source region of the second PMOS PD transistor 116, the gates of the first NMOS PU transistor 106 and the first PMOS PD transistor 114, and to a drain/source region of the second PMOS access control transistor 112. The other drain/source region of the second PMOS PD transistor 116 is electrically connected to the reference 130, such as ground.

The PMOS access control transistors 110 and 112 are connected to control access to the cross-coupled inverters 126 and 128 by selectively connecting the 6T SRAM cell 100 to the bit line BL 118 and to the bit line bar BLB 120. One drain/source region of the first PMOS access control transistor 110 is electrically connected to the drain/source region of the first NMOS PU transistor 106, the drain/source region of the first PMOS PD transistor 114, and the gates of the second NMOS PU transistor 108 and the second PMOS PD transistor 116. The other drain/source region of the first PMOS access control transistor 110 is electrically connected to the bit line BL 118. The gate of the first PMOS access control transistor 110 is electrically connected to the word line WL 122. Also, one drain/source region of the second PMOS access control transistor 112 is electrically connected to the drain/source region of the second NMOS PU transistor 108, the drain/source region of the second PMOS PD transistor 116, and the gates of the first NMOS PU transistor 106 and the first PMOS PD transistor 114. The other drain/source region of the second PMOS access control transistor 112 is electrically connected to the bit line bar BLB 120. The gate of the second PMOS access control transistor 112 is electrically connected to the word line WL 122.

In operation, a controller, such as the controller 48 (shown in FIG. 1), provides signals to the word line WL 122 to control access to the two cross-coupled inverters 126 and 128 by selectively connecting the 6T SRAM cell 100 to the bit line BL 118 and the bit line bar BLB 120.

In this example, the first and second NMOS PU transistors 106 and 108 are formed on the one or more upper layers 102 and the first and second PMOS access control transistors 110 and 112 and the first and second PMOS PD transistors 114 and 116 are formed on the one or more lower layers 104.

In some embodiments, the first and second NMOS PU transistors 106 and 108 formed on the upper layers 102 are situated above the first and second PMOS access control transistors 110 and 112 and the first and second PMOS PD transistors 114 and 116 formed on the lower layers 104, such that a footprint of the first and second NMOS PU transistors 106 and 108 on the upper layers 102 is within a footprint of the first and second PMOS access control transistors 110 and 112 and the first and second PMOS PD transistors 114 and 116 on the lower layers 104. This results in reducing the amount of area consumed by the 6T SRAM cell 100 from the area consumed by all six transistors on one layer to the area consumed by the four transistors on the lower layers 104. Thus, the area consumed by having four transistors on the lower layers 104 is 0.66 times the area consumed by all six transistors on one layer.

Also, in some embodiments, the first and second NMOS PU transistors 106 and 108 formed on the upper layers 102 are situated above the first and second PMOS access control transistors 110 and 112 and the first and second PMOS PD transistors 114 and 116 formed on the lower layers 104, such that a footprint of the first and second PMOS access control transistors 110 and 112 and the first and second PMOS PD transistors 114 and 116 on the lower layers 104 is within a footprint of the first and second NMOS PU transistors 106 and 108 on the upper layers 102. This results in reducing the amount of area consumed by the 6T SRAM cell 100 from the area consumed by all six transistors on one layer to the area consumed by the two transistors on the upper layers 102.

In some embodiments, the first and second NMOS PU transistors 106 and 108 are NMOS BETr transistors and the first and second PMOS access control transistors 110 and 112 and the first and second PMOS PD transistors 114 and 116 are PMOS finFET transistors. In some embodiments, the first and second NMOS PU transistors 106 and 108 are thin film transistors. In some embodiments, the BETr transistors include IGZO. In some embodiments, the BETr transistors include ITO. In other embodiments, the BETr transistors include other materials, such as other semiconductor oxide materials. The NMOS BETr transistors are fabricated in a BEOL process, which reduces the cost of fabricating the memory device and the cost of the memory device.

In addition, in some embodiments, the speed of the 6T SRAM cell 100 with the first and second NMOS PU transistors 106 and 108 disposed in the upper layers 102 and the PMOS PD transistors 114 and 116 disposed in the lower layers 104 is equal to or substantially equal to the speed of a conventional one-layer SRAM cell. Since the supply voltage PWR 124 propagates from an upper layer to lower layers, the transference path to the NMOS BETr transistors is shorter and loading of the NMOS BETr transistors is decreased. Thus, by disposing the NMOS BETr transistors in the upper layers 102, the speed of the NMOS BETr transistors can be improved to be compatible or substantially compatible with conventional NMOS finFET transistors and the performance of the 6T SRAM cell can be improved to be equal or substantially equal to the performance of a conventional finFET SRAM cell.

Figure 3:
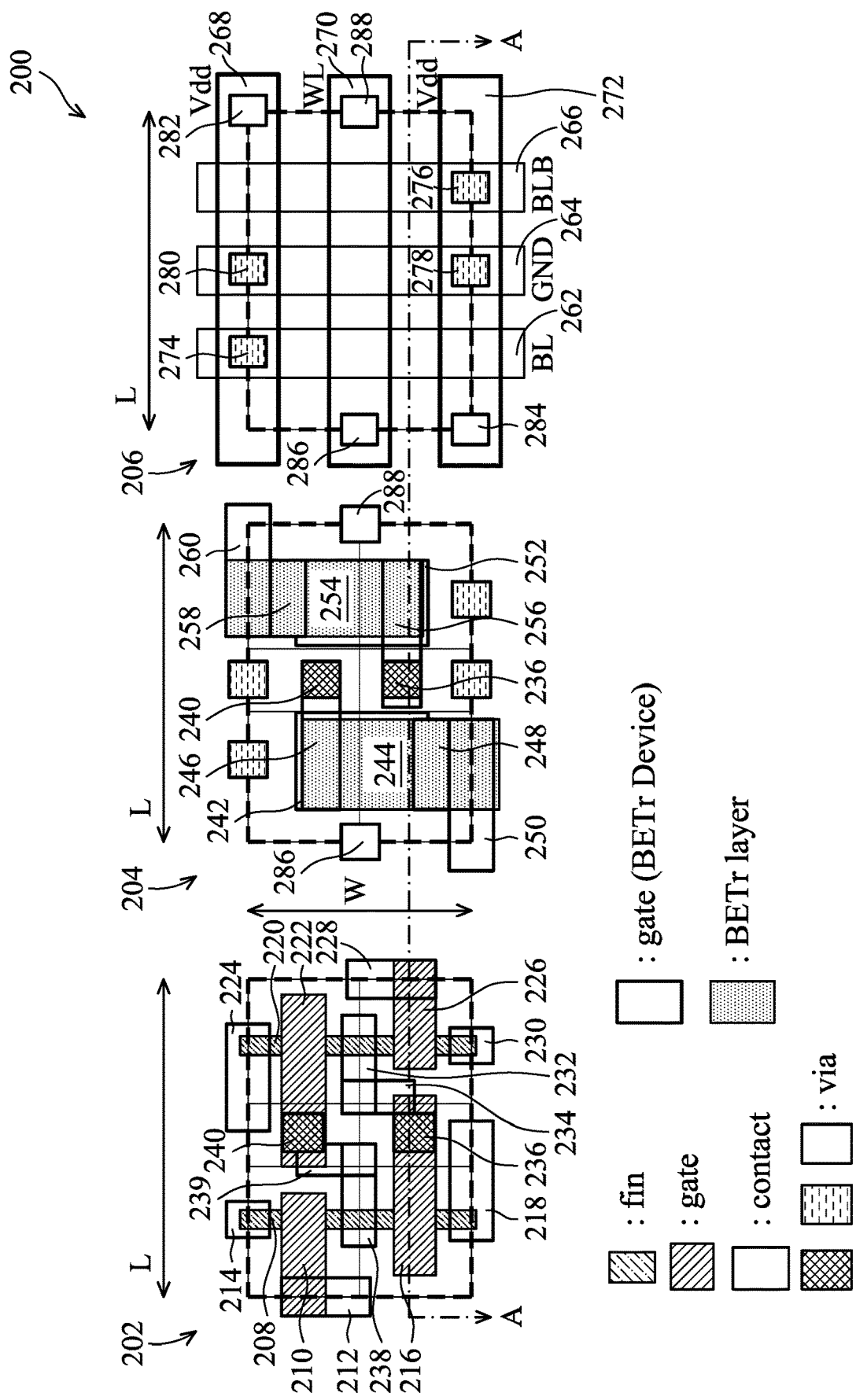
FIG. 3 is a diagram schematically illustrating a memory cell layout of the 6T SRAM cell of FIG. 2, in accordance with some embodiments.

FIG. 3 is a diagram schematically illustrating a memory cell layout 200 of the 6T SRAM cell 100 of FIG. 2, in accordance with some embodiments. The layout 200 includes lower layers 202, upper layers 204, and interconnect layers 206, where each of the lower layers 202, the upper layers 204, and the interconnect layers 206 has a length L and a width W and the layers are stacked one upon the other with the lower layers 202 on the bottom, the upper layers 204 in the middle, and the interconnect layers 206 on top. In some embodiments, the length L is 5 Fin (F) and the width W is 2 Poly (P). In some embodiments, the lower layers 202 are like the one or more lower layers 104 (shown in FIG. 2). In some embodiments, the upper layers 204 are like the one or more upper layers 102 (shown in FIG. 2).

The first PMOS access control transistor 110, the second PMOS access control transistor 112, the first PMOS PD transistor 114, and the second PMOS PD transistor 116 are formed in the lower layers 202. The first NMOS PU transistor 106 and the second NMOS PU transistor 108 are formed in the upper layers 204. In some embodiments, the first PMOS access control transistor 110, the second PMOS access control transistor 112, the first PMOS PD transistor 114, and the second PMOS PD transistor 116 are PMOS finFET transistors. In some embodiments, the first NMOS PU transistor 106 and the second NMOS PU transistor 108 are NMOS BETr planar transistors, such as thin film transistors.

The lower layers 202 include a first fin structure 208 disposed on a substrate and a first gate structure 210 that overlaps the first fin structure 208 to form the first PMOS access control transistor 110, also referred to as the first PMOS pass-gate transistor. The first gate structure 210 is electrically connected to a contact 212 and a word line WL. Also, one drain/source region of the first fin structure 208 that is part of the first PMOS access control transistor 110 is electrically connected to a contact 214 and a bit line BL. A second gate structure 216 that is separate from the first gate structure 210 overlaps the first fin structure 208 to form the first PD transistor 114 with one drain/source region of the fin structure 208 that is part of the first PD transistor 114 electrically connected to a contact 218 and a ground line GND.

The lower layers 202 further include a second fin structure 220 disposed on the substrate parallel to the first fin structure 208 and separate from the first fin structure 208. A third gate structure 222 overlaps the second fin structure 220 to form the second PD transistor 116 with one drain/source region of the fin structure 220 that is part of the second PD transistor 116 electrically connected to a contact 224 and the ground line GND. A fourth gate structure 226 that is separate from the third gate structure 222 overlaps the second fin structure 220 to form the second PMOS access control transistor 112, also referred to as the second PMOS pass-gate transistor. The fourth gate structure 226 is electrically connected to a contact 228 and the word line WL with one drain/source region of the second fin structure 220 that is part of the second PMOS access control transistor 112 electrically connected to a contact 230 and a bit line bar BLB. The other drain/source region of the second fin structure 220 that is shared by the second PMOS access control transistor 112 and the second PD transistor 116 is electrically connected through contacts 232 and 234 and via 236 to the second gate structure 216 of the first PD transistor 114. Also, the other drain/source region of the first fin structure 208 that is shared by the first PMOS access control transistor 110 and the first PD transistor 114 is electrically connected through contacts 239 and 238 and via 240 to the third gate structure 222 of the second PD transistor 116.

The upper layers 204 include a fifth gate structure 242 (BETr device) disposed over the second gate structure 216 and electrically connected to the second gate structure 216 of the first PD transistor 114. A first semiconductor oxide structure 244 (BETr layer) is disposed on the fifth gate structure 242 with a first drain/source region and a second drain/source region on the first semiconductor oxide structure 244. The fifth gate structure 242 and the first semiconductor oxide structure 244 with the first drain/source region and the second drain/source region constitute the first NMOS PU transistor 106. Also, the other drain/source region of the first fin structure 208 that is shared by the first PMOS access control transistor 110 and the first PD transistor 114 is electrically connected through contacts 239 and 238 and via 240 to the third gate structure 222 of the second PD transistor 116 and to the first drain/source region of the first semiconductor oxide structure 244 through the via 240 and a contact 246. The second drain/source region of the first semiconductor oxide structure 244 is electrically connected through contacts 248 and 250 to power VDD (PWR).

The upper layers 204 further include a sixth gate structure 252 (BETr device) disposed over the third gate structure 222 and electrically connected to the third gate structure 222 of the second PD transistor 116. A second semiconductor oxide structure 254 (BETr layer) is disposed on the sixth gate structure 252 with a first drain/source region and a second drain/source region on the second semiconductor oxide structure 254. The sixth gate structure 252 and the first semiconductor oxide structure 254 with the first drain/source region and the second drain/source region constitute the second NMOS PU transistor 108. Also, the other drain/source region of the second fin structure 220 that is shared by the second PMOS access control transistor 112 and the second PD transistor 116 is electrically connected through contacts 232 and 234 and via 236 to the second gate structure 216 of the first PD transistor 114 and to the first drain/source region of the second semiconductor oxide structure 254 through the via 236 and a contact 256. The second drain/source region of the second semiconductor oxide structure 254 is electrically connected to contacts 258 and 260 to power VDD (PWR).

The interconnect layers 206 include a bit line BL 262, a ground line GND 264, a bit line bar BLB 266, a first power line VDD 268, a word line WL 270, and a second power line VDD 272. The bit line BL 262 is electrically connected to the fin structure 208 through via 274 and contact 214. The bit line bar BL 266 is electrically connected to the fin structure 220 through via 276 and contact 230. The ground line GND 264 is electrically connected to fin structure 208 through via 278 and contact 218, and to fin structure 220 through via 280 and contact 224.

Also, the first power line VDD 268 is electrically connected to the second semiconductor oxide structure 254 through via 282 and contacts 258 and 260, and the second power line VDD 272 is electrically connected to the first semiconductor oxide structure 244 through via 284 and contacts 248 and 250. The word line WL 270 is electrically connected to the first gate structure 210 through via 286 and contact 212, and to the fourth gate structure 226 through via 288 and contact 228.

In some embodiments, the lower layers 202 include a silicon bottom layer and the upper layers 204 include metal layers, such as a metal-2 layer and/or a metal-3 layer. In some embodiments, the upper layers 204 include layers higher than the metal-2 layer and the metal-3 layer. In some embodiments, the upper layers 204 include a metal-4 layer, a metal-5 layer, and/or one or more higher upper layers. Additionally, in some embodiments, the BETr transistors are distributed across two or more layers. For example, one or more BETr transistors can be disposed in a first layer, such as a metal-2 layer, and another one or more BETr transistors can be disposed in a second layer that is positioned over the first layer, such as a metal-3 layer.

Figure 4:
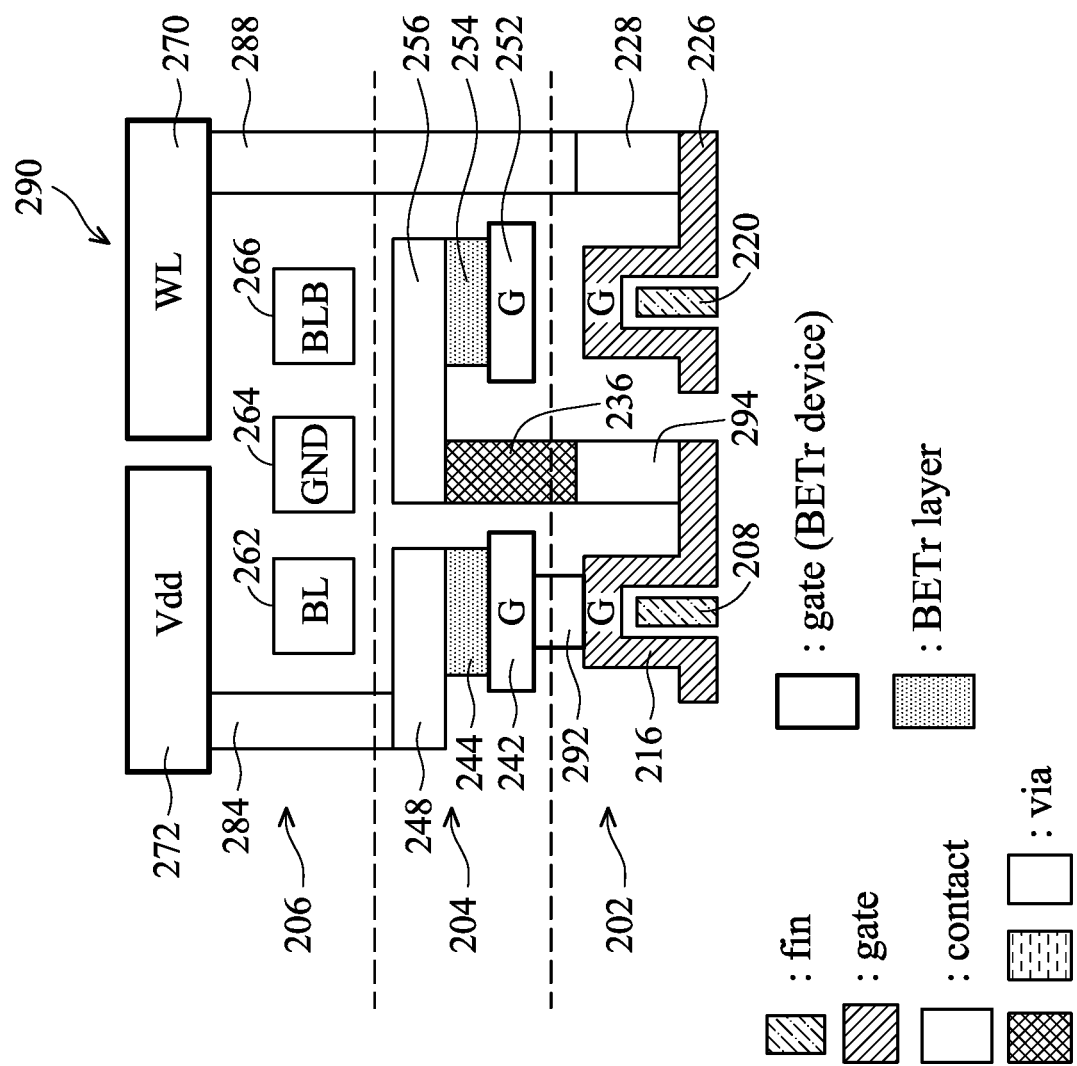
FIG. 4 is a diagram schematically illustrating a stacked cross-section including the lower layers, the upper layers, and the interconnect layers of the memory cell layout taken along the line A-A in FIG. 3, in accordance with some embodiments.

FIG. 4 is a diagram schematically illustrating a stacked cross-section 290 including the lower layers 202, the upper layers 204, and the interconnect layers 206 of the memory cell layout 200 taken along the line A-A in FIG. 3, in accordance with some embodiments. The interconnect layers 206 are situated over the upper layers 204 and include the bit line BL 262, the ground line GND 264, and the bit line bar BLB 266. The upper layers 204 are situated over the lower layers 202.

The stacked cross-section 290 includes the second gate structure 216 overlapping the first fin structure 208 to form the first PD transistor 114. The second gate structure 216 is electrically connected to the fifth gate structure 242 (BETr device) that is disposed over the second gate structure 216 and electrically connected to the second gate structure 216 by a contact 292. The first semiconductor oxide structure 244 (BETr layer) is disposed over the fifth gate structure 242 with one drain/source region of the first semiconductor oxide structure 244 connected to the second power VDD 272 through contact 248 and via 284. (Note that the via 284 and the second power line VDD 272 are not in the stacked cross-section 290 along the line A-A of FIG. 3, however, they are shown for showing the connection from the first semiconductor oxide structure 244 to the second power line VDD 272).

The stacked cross-section 290 further includes the fourth gate structure 226 overlapping the second fin structure 220 to form the second PMOS access control transistor 112, also referred to as the second PMOS pass-gate transistor. The fourth gate structure 226 is electrically connected to the word line 270 through via 288 and contact 228. (Note that the via 288 and the word line 270 are not in the stacked cross-section 290 along the line A-A of FIG. 3, however, they are shown for showing the connection from the fourth gate structure 226 to the word line 270).

The stacked cross-section 290 further includes the sixth gate structure 252 (BETr device) disposed over the fourth gate structure 226, and the second semiconductor oxide structure 254 (BETr layer) disposed over the sixth gate structure 252. The drain/source region of the second semiconductor oxide structure 254 is electrically connected to the second gate structure 216 through the contact 256, the via 236, and the contact 294.

Figure 5:
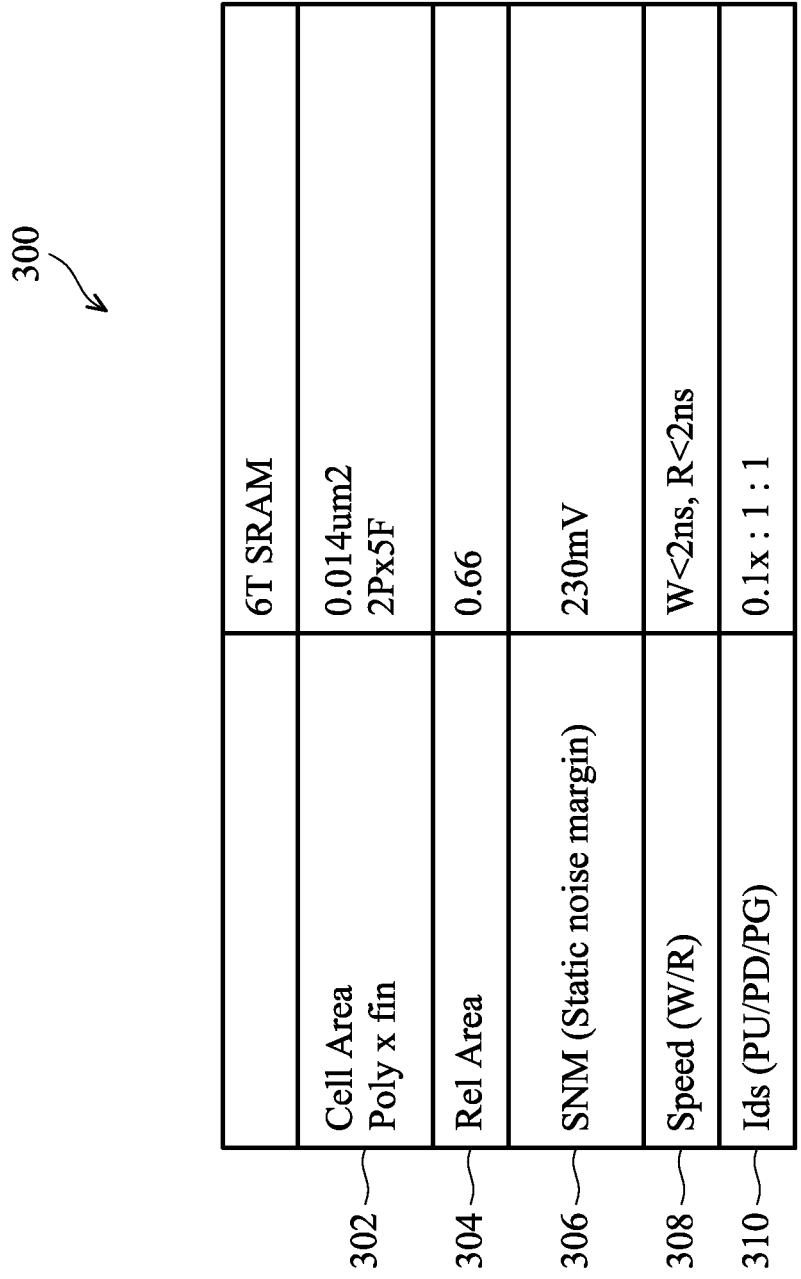
FIG. 5 is a diagram schematically illustrating a table that includes characteristics of the 6T SRAM cell of FIG. 2, in accordance with some embodiments.

FIG. 5 is a diagram schematically illustrating a table 300 that includes characteristics of the 6T SRAM cell 100 of FIG. 2, in accordance with some embodiments. The table 300 includes rows for cell area 302, relative cell area 304, static noise margin (SNM) 306, speed 308 including write (W) and read (R) speeds and drain-source currents (Ids) 310.

In some embodiments, the 6T SRAM cell 100 having the stacked layout of FIGS. 3 and 4 has a cell area at 302 of 0.014 micrometers squared ($\mu m^2$), with a length of 5 F and a width of 2 P. The relative cell area at 304 of the stacked layout of FIGS. 3 and 4 is 0.66 times the cell area of a six transistor finFET SRAM cell on one layer.

Also, the 6T SRAM cell 100 has a SNM at 306 of 230 millivolts (mV) and, at 308, the 6T SRAM cell 100 has a write speed (W) of less than 2 nanoseconds (ns) and a read speed (R) of less than 2 ns, which compares favorably to the six transistor finFET SRAM cell on one layer. In addition, the Ids at 310 through the BETr PU (PU) transistors of the 6T SRAM cell 100 is 0.1 times the Ids through the PU transistors of the six transistor SRAM cell on one layer and the Ids through the PD transistors and the pass-gate (PG) transistors are the same as the Ids through the PD transistors and the PG transistors of the six transistor SRAM cell on one layer.

Figure 6:
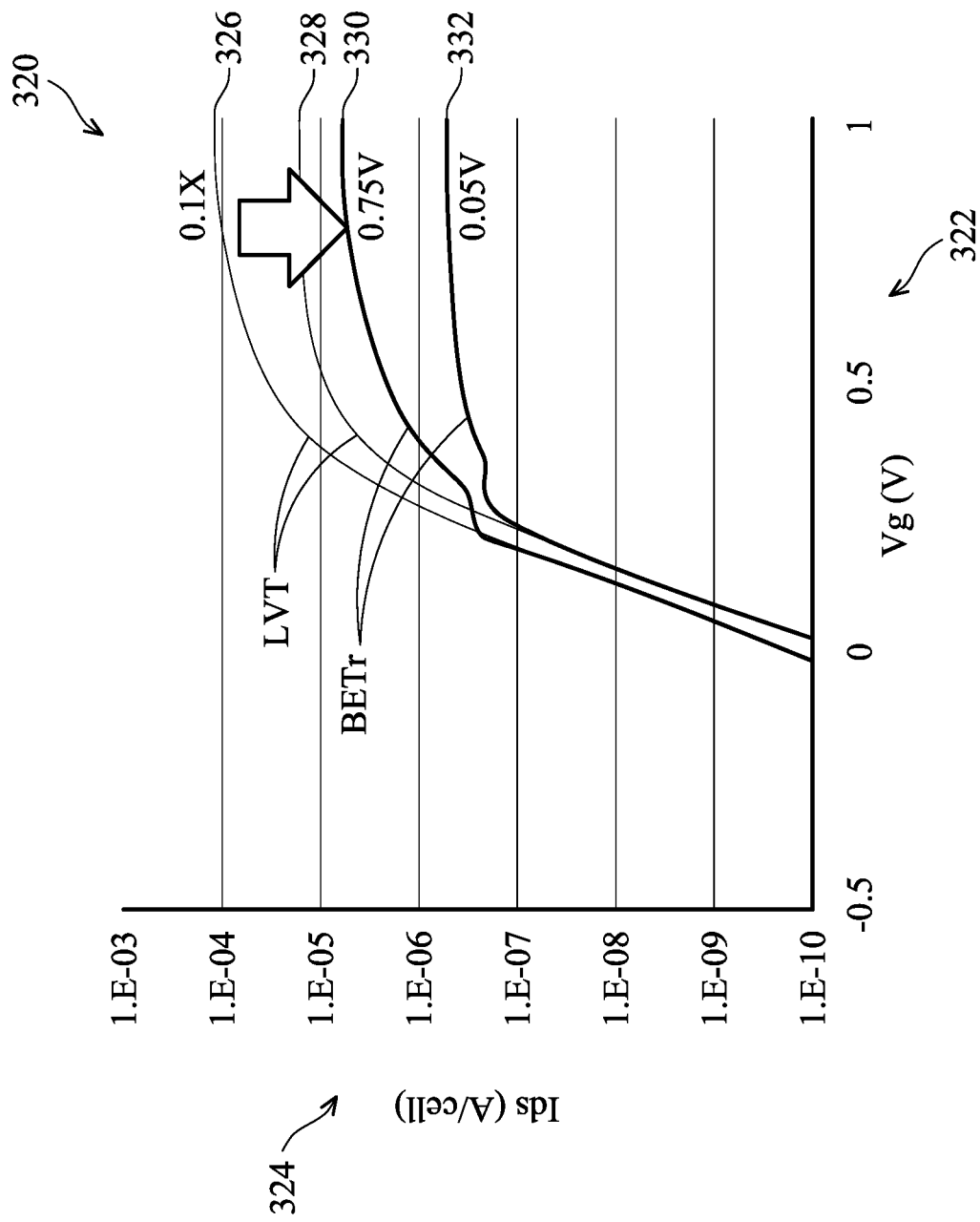
FIG. 6 is a diagram illustrating a graph of drain-source current (Ids) through the pull-up (PU) transistors of the six transistor SRAM cell on one layer and through the back-end-of-line transistor (BETr) PU transistors of the 6T SRAM cell, in accordance with some embodiments.

FIG. 6 is a diagram illustrating a graph 320 of Ids through the PU transistors of the six transistor SRAM cell on one layer and through the BETr PU transistors of the 6T SRAM cell 100, in accordance with some embodiments. The graph 320 includes gate voltage (Vg) on the x-axis 322 vs Ids in amperes per cell (A/cell) on the y-axis 324.

The graph 320 illustrates the Ids through NMOS low threshold voltage (LVT) transistors of the six transistor finFET SRAM cell on one layer at 326 and 328 and the Ids through BETr transistors of the 6T SRAM cell 100 at 330 and 332. The Ids through the BETr PU transistors of the 6T SRAM cell 100 at 330 and 332 is about 0.1 times the Ids through the PU transistors of the six transistor SRAM cell on one layer at 326 and 328.

Figure 7:
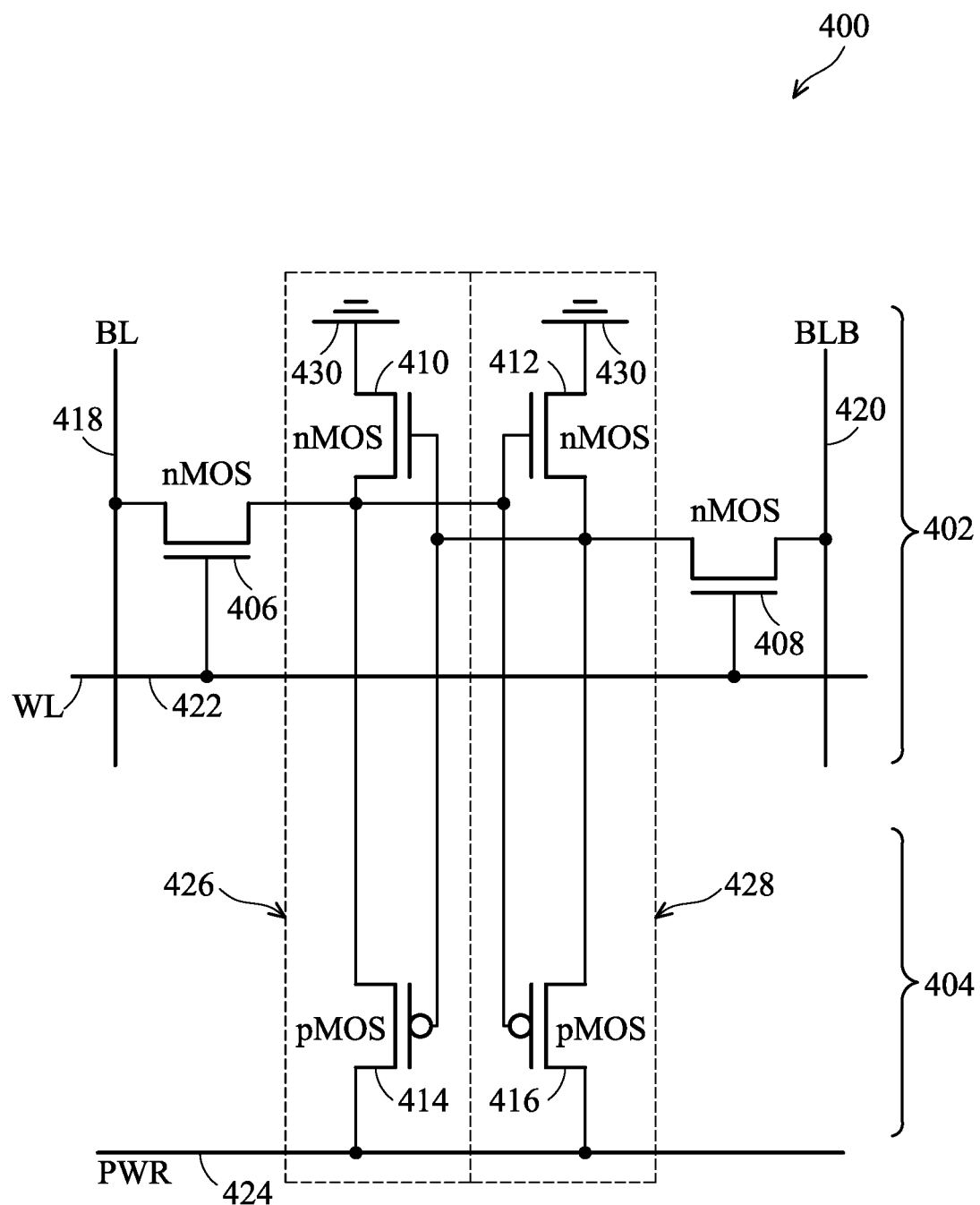
FIG. 7 is a diagram schematically illustrating a 6T SRAM cell that includes four transistors formed on one or more upper layers and two transistors formed on one or more lower layers, in accordance with some embodiments.

FIG. 7 is a diagram schematically illustrating a 6T SRAM cell 400 that includes four transistors formed on one or more upper layers 402 and two transistors formed on one or more lower layers 404, in accordance with some embodiments. The 6T SRAM cell 400 includes a first NMOS access control transistor 406, a second NMOS access control transistor 408, a first NMOS PD transistor 410, and a second NMOS PD transistor 412 formed on the one or more upper layers 402, such as a metal-2 layer and/or a metal-3 layer. The 6T SRAM cell 400 includes a first PMOS PU transistor 414 and a second PMOS PU transistor 416 formed on the one or more lower layers 404, such as a silicon bottom layer of the semiconductor device. The 6T SRAM cell 400 is configured to be used in a memory device, such as the memory device 40 of FIG. 1. In some embodiments, the 6T SRAM cell 400 is like one of the memory cells 44.

The 6T SRAM cell 400 is electrically connected to a bit line BL 418 and a bit line bar BLB 420, like the bit line BL and bit line bar BLB of the memory device 40. Also, the SRAM cell 400 is electrically connected to a word line WL 422, like the word line WL of the memory device 40. In addition, the SRAM cell 400 is electrically connected to receive a power supply voltage PWR 424. In other embodiments, the SRAM cell 400 is a different type of SRAM cell, such as a 4T SRAM cell or an 8T SRAM cell.

The 6T SRAM cell 400 includes the two NMOS access control transistors 406 and 408 and two cross-coupled inverters 426 and 428. The cross-coupled inverters 426 and 428 are configured to store one bit of information and the NMOS access control transistors 406 and 408 are configured to control access to the cross-coupled inverters 426 and 428.

The first cross-coupled inverter 426 includes the first PMOS PU transistor 414 and the first NMOS PD transistor 410. One drain/source region of the first PMOS PU transistor 414 is electrically connected to receive the power supply voltage PWR 424 and the other drain/source region of the first PMOS PU transistor 414 is electrically connected to a drain/source region of the first NMOS PD transistor 410, the gates of the second PMOS PU transistor 416 and the second NMOS PD transistor 412, and to a drain/source region of the first NMOS access control transistor 406. The other drain/source region of the first NMOS PD transistor 410 is electrically connected to a reference 430, such as ground.

The second cross-coupled inverter 428 includes the second PMOS PU transistor 416 and the second NMOS PD transistor 412. One drain/source region of the second PMOS PU transistor 416 is electrically connected to receive the power supply voltage PWR 424 and the other drain/source region of the second PMOS PU transistor 416 is electrically connected to a drain/source region of the second NMOS PD transistor 412, the gates of the first PMOS PU transistor 414 and the first NMOS PD transistor 410, and to a drain/source region of the second NMOS access control transistor 408. The other drain/source region of the second NMOS PD transistor 412 is electrically connected to the reference 430, such as ground.

The NMOS access control transistors 406 and 408 are connected to control access to the cross-coupled inverters 426 and 428 by selectively connecting the 6T SRAM cell 400 to the bit line BL 418 and to the bit line bar BLB 420. One drain/source region of the first NMOS access control transistor 406 is electrically connected to the drain/source region of the first PMOS PU transistor 414, the drain/source region of the first NMOS PD transistor 410, and the gates of the second PMOS PU transistor 416 and the second NMOS PD transistor 412. The other drain/source region of the first NMOS access control transistor 406 is electrically connected to the bit line BL 418. The gate of the first NMOS access control transistor 406 is electrically connected to the word line WL 422. Also, one drain/source region of the second NMOS access control transistor 408 is electrically connected to the drain/source region of the second PMOS PU transistor 416, the drain/source region of the second NMOS PD transistor 412, and the gates of the first PMOS PU transistor 414 and the first NMOS PD transistor 410. The other drain/source region of the second NMOS access control transistor 408 is electrically connected to the bit line bar BLB 420. The gate of the second NMOS access control transistor 408 is electrically connected to the word line WL 422.

In operation, a controller, such as the controller 48 (shown in FIG. 1), provides signals to the word line WL 422 to control access to the two cross-coupled inverters 426 and 428 by selectively connecting the 6T SRAM cell 400 to the bit line BL 418 and the bit line bar BLB 420.

In this example, the first and second PMOS PU transistors 414 and 416 are formed on the one or more lower layers 404 and the first and second NMOS access control transistors 406 and 408 and the first and second NMOS PD transistors 410 and 412 are formed on the one or more upper layers 402. In some embodiments, the first and second NMOS access control transistors 406 and 408 and the first and second NMOS PD transistors 410 and 412 formed on the upper layers 402 are situated above the first and second PMOS PU transistors 414 and 416 formed on the lower layers 404, such that a footprint of the first and second NMOS access control transistors 406 and 408 and the first and second NMOS PD transistors 410 and 412 formed on the upper layers 402 is within a footprint of the first and second PMOS PU transistors 414 and 416 formed on the lower layers 404. This results in reducing the amount of area consumed by the 6T SRAM cell 400 from the area consumed by all six transistors on one layer to the area consumed by the two transistors on the lower layers 404. Thus, in some embodiments, the area consumed by having two transistors on the lower layers 404 could be 0.33 times the area consumed by all six transistors on one layer.

Also, in some embodiments, the first and second NMOS access control transistors 406 and 408 and the first and second NMOS PD transistors 410 and 412 formed on the upper layers 402 are situated above the first and second PMOS PU transistors 414 and 416 formed on the lower layers 404, such that a footprint of the first and second PMOS PU transistors 414 and 416 formed on the lower layers 404 is within a footprint of the first and second NMOS access control transistors 406 and 408 and the first and second NMOS PD transistors 410 and 412 formed on the upper layers 402. This results in reducing the amount of area consumed by the 6T SRAM cell 400 from the area consumed by all six transistors on one layer to the area consumed by the four transistors on the upper layers 402.

In some embodiments, the first and second NMOS access control transistors 406 and 408 and the first and second NMOS PD transistors 410 and 412 are NMOS BETr transistors and the first and second PMOS PU transistors 414 and 416 are PMOS finFET transistors. In some embodiments, the first and second NMOS access control transistors 406 and 408 and the first and second NMOS PD transistors 410 and 412 are thin film transistors. In some embodiments, the BETr transistors include IGZO. In some embodiments, the BETr transistors include ITO. In other embodiments, the BETr transistors include other materials, such as other semiconductor oxide materials. The NMOS BETr transistors are fabricated in a BEOL process, which reduces the cost of fabricating the memory device and the cost of the memory device.

FIGS. 8-19 are diagrams schematically illustrating a process for manufacturing memory cells, such as the 6T SRAM cell 100 of FIG. 2 and the 6T SRAM cell 400 of FIG. 7. In some embodiments, this process is used for manufacturing other memory cells, including SRAM cells that have more or less than six transistors, such as 4T SRAM cells and 8T SRAM cells and, in some embodiments, this process is used for manufacturing memory cells, such as SRAM cells that include resistors. The process includes manufacturing finFET transistors and manufacturing planar BETr transistors, such as thin film transistors.

FIGS. 8-14 are diagrams schematically illustrating a process for manufacturing finFET transistors, such as finFET transistors in the lower layers 104 and 404. In some embodiments, the first PMOS access control transistor 110, the second PMOS access control transistor 112, the first PMOS PD transistor 114, and the second PMOS PD transistor 116 are PMOS finFET transistors manufactured by this process. In some embodiments, the first and second PMOS PU transistors 414 and 416 are PMOS finFET transistors manufactured by this process.

Figure 8:
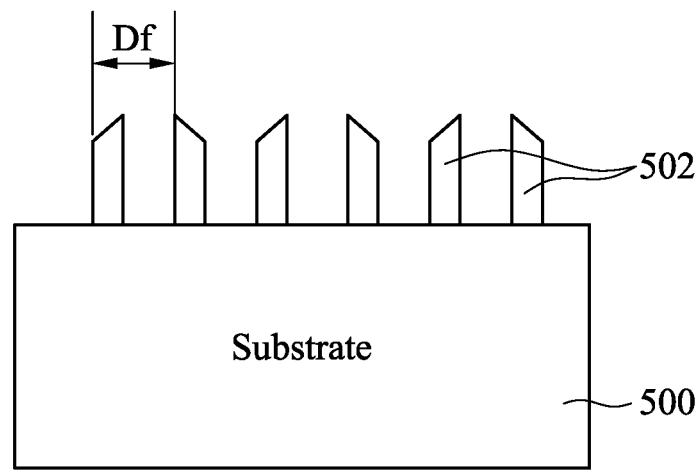
FIG. 8 is a diagram schematically illustrating a substrate having an etched hard mask disposed on the substrate, in accordance with some embodiments.
Figure 9:
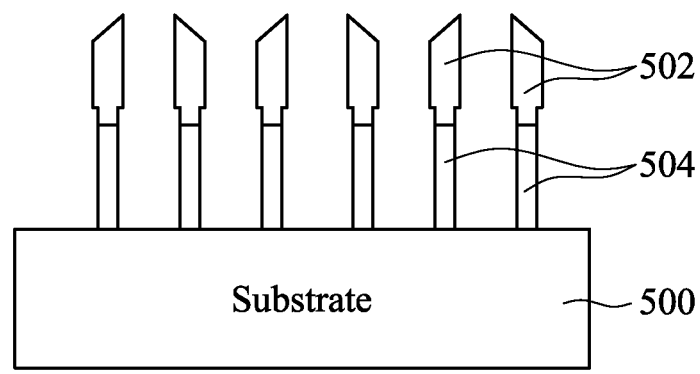
FIG. 9 is a diagram schematically illustrating the substrate etched to form fins on the substrate, in accordance with some embodiments.
Figure 10:
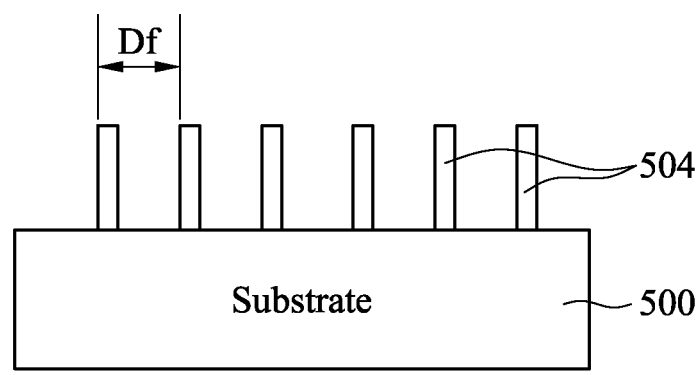
FIG. 10 is a diagram schematically illustrating the fins on the substrate, in accordance with some embodiments.

FIGS. 8-10 are diagrams schematically illustrating a process for oxide diffusion (OD) fin formation, in accordance with some embodiments, where the OD is the active region of the finFET.

FIG. 8 is a diagram schematically illustrating a substrate 500 having an etched hard mask 502 disposed on the substrate 500, in accordance with some embodiments. The process includes providing an OD hard mask film deposition on the substrate 500, followed by an OD photolithography step and an OD hard mask etch that includes etching the hard mask material. This results in the substrate 500 having the etched hard mask 502 disposed on the substrate 500.

FIG. 9 is a diagram schematically illustrating the substrate 500 etched to form fins 504 on the substrate 500, in accordance with some embodiments. The substrate 500 is etched in an OD etch step to form the fins 504. Next, an OD wet clean step and an OD fin formation step are performed to remove the hard mask 502 and form the fins 504.

FIG. 10 is a diagram schematically illustrating the fins 504 on the substrate 500, in accordance with some embodiments. The fins 504 have a distance Df from one edge of one fin 504 to a corresponding edge of an adjacent fin 504.

FIGS. 11-14 are diagrams schematically illustrating a process for polysilicon film processing, gate replacement, and contact formation in forming the finFET, in accordance with some embodiments.

Figure 11:
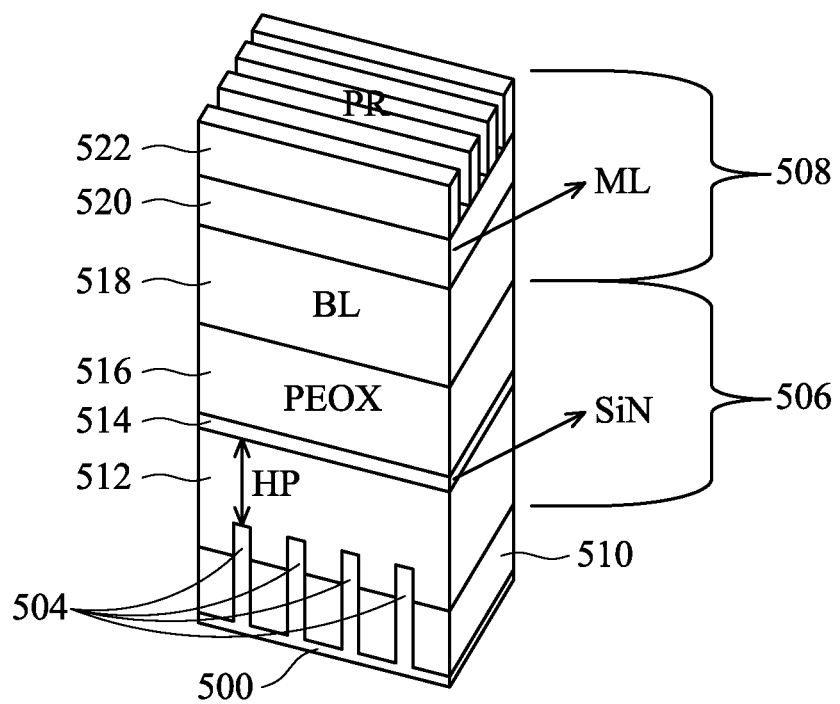
FIG. 11 is a diagram schematically illustrating polysilicon film deposition layers and polysilicon photolithography layers disposed over the substrate and the fins, in accordance with some embodiments.

FIG. 11 is a diagram schematically illustrating polysilicon film deposition layers 506 and polysilicon photolithography layers 508 disposed over the substrate 500 and the fins 504, in accordance with some embodiments. An oxide layer 510 is disposed on the substrate 500 and around the base of the fins 504.

The polysilicon film deposition layers 506 are disposed on the oxide layer 510 and the fins 504 in a polysilicon film deposition step. A polysilicon layer 512 is disposed on the oxide 510 and around the fins 504 to a polysilicon height Hp above the top of the fins 504. Then, a silicon nitride (SiN) layer 514 is disposed on the polysilicon layer 512 and a polyethylene oxide (PEOX) layer 516 is disposed on the SiN layer 514.

Next, the polysilicon photolithography layers 508 are disposed on the PEOX layer 516 in a polysilicon photolithography step. A bottom layer (BL) 518 is disposed on the PEOX layer 516, a middle layer (ML) 520 is disposed on the BL 518, and a photoresist layer (PR) 522 is disposed on the ML 520.

Figure 12:
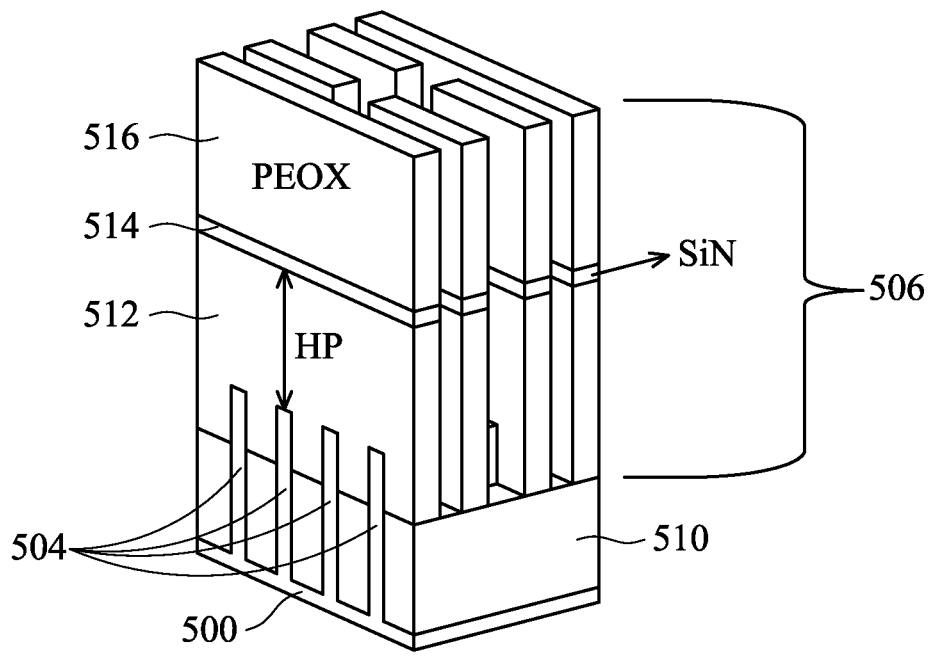
FIG. 12 is diagram schematically illustrating the polysilicon film deposition layers etched away and situated over the oxide and fins, in accordance with some embodiments.

FIG. 12 is diagram schematically illustrating the polysilicon film deposition layers 506 etched away and situated over the oxide 510 and fins 504, in accordance with some embodiments. The polysilicon film deposition layers 506 including the polysilicon layer 512, the SiN layer 514, and the PEOX layer 516 are etched in a polysilicon etch step and cleaned in a polysilicon wet clean step. The result is etching of the polysilicon film deposition layers 506 as shown in FIG. 12.

Figure 13:
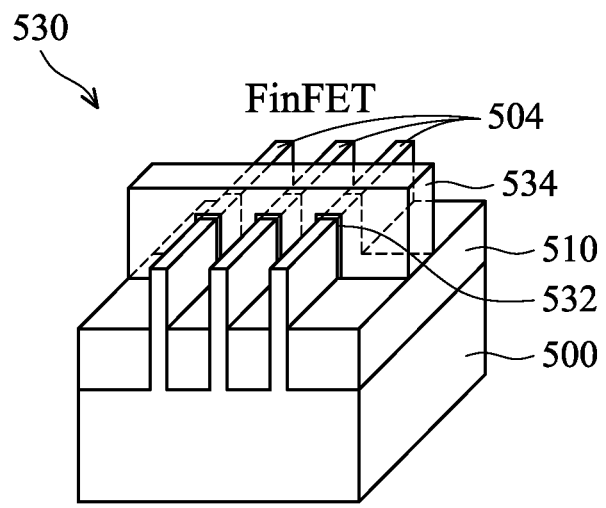
FIG. 13 is a diagram schematically illustrating a fin field-effect transistor (finFET), in accordance with some embodiments.

FIG. 13 is a diagram schematically illustrating a finFET 530, in accordance with some embodiments. After the polysilicon wet clean step, the process includes a polysilicon dummy gate formation step for forming a dummy gate, followed by a drain/source formation step. Next, the dummy gate is replaced by gate materials including a gate dielectric 532 and a conductive gate 534 in a gate replacement step and the result is the finFET 530 of FIG. 13.

Figure 14:
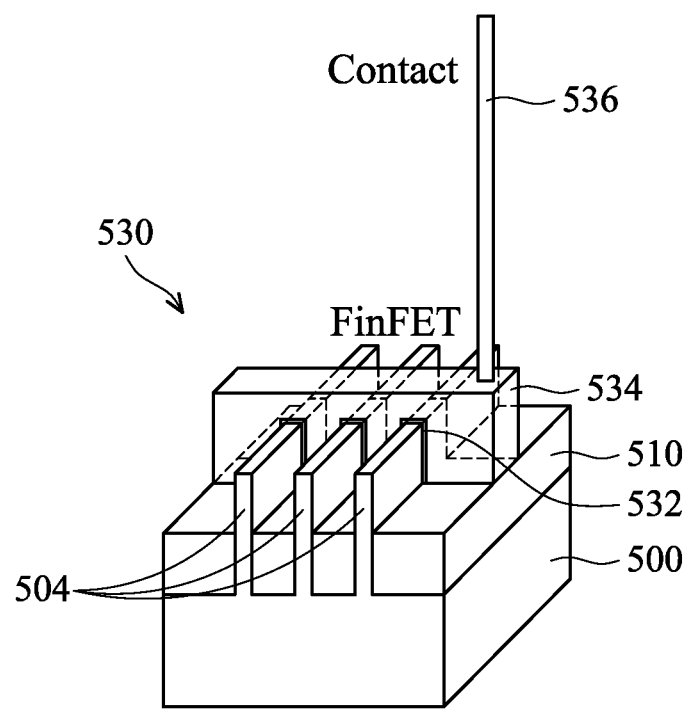
FIG. 14 is a diagram schematically illustrating a contact electrically connected to the finFET, in accordance with some embodiments.

FIG. 14 is a diagram schematically illustrating a contact 536 electrically connected to the finFET 530, in accordance with some embodiments. In a process for electrically connecting the contact 536 to the finFET 530, an interlayer dielectric (ILD) deposition step is followed by an ILD photolithography steps. Contact holes are etched through one or more layers in a contact hole etch step and a contact metal plug is formed in a contact metal plug formation step. The contact 536 is then formed in a contact formation step.

FIGS. 15-19 are diagrams schematically illustrating a process for manufacturing BETr transistors, such as BETr transistors in the upper layers 102 and 402, and for electrically connecting the BETr transistors to the finFET transistors. The BETr transistors are planar, thin film transistors. Also, the BETr transistors are metal-oxide-semiconductor field-effect transistors (MOSFETS). In some embodiments, the BETr transistors are NMOS BETr transistor and, in some embodiments, the BETr transistor are PMOS BETr transistors.

The BETr transistors are fabricated in a BEOL process, which often reduces the fabrication costs. In some embodiments, the first NMOS PU transistor 106 and the second NMOS PU transistor 108 are NMOS BETr transistors manufactured by this process. In some embodiments, the first and second NMOS access control transistors 406 and 408 and the first and second NMOS PD transistors 410 and 412 are NMOS BETr transistors manufactured by this process.

Figure 15:
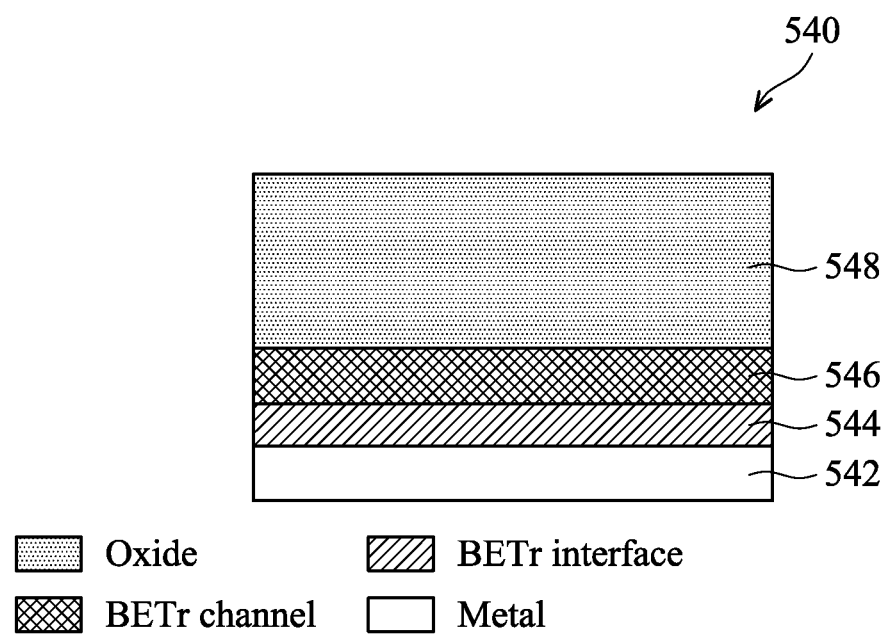
FIG. 15 is a diagram schematically illustrating a BETr film that has been deposited in a BETr film deposition step onto the SRAM area of the memory device for manufacturing a BETr transistor, in accordance with some embodiments.

FIG. 15 is a diagram schematically illustrating a BETr film 540 that has been deposited in a BETr film deposition step onto the SRAM area of the memory device for manufacturing a BETr transistor, in accordance with some embodiments. The BETr film 540 includes a metal layer 542, a BETr interface layer 544, a BETr channel layer 546, and an oxide layer 548.

The metal layer 542 is disposed on the SRAM area of the memory device. The metal layer 542 can be etched and manufactured into the metal gate contact of the BETr transistor.

Next, the BETr interface layer 544 is disposed on the metal layer 542. The BETr interface layer 544 is the gate dielectric of the BETr transistor, where in some embodiments, the gate dielectric includes aluminum oxide ($Al_2O_3$) and/or hafnium oxide ($HfO_2$).

The BETr channel layer 546 is disposed on the BETr interface layer 544. The BETr channel layer 546 is the channel material of the BETr transistor. In some embodiments, the BETr channel layer 546 includes IGZO. In some embodiments, the BETr channel layer 546 includes ITO. In some embodiments, the BETr channel layer 546 includes other suitable semiconductor oxide materials.

The oxide layer 548 is disposed on the BETr channel layer 546. The oxide layer 548 is etched into an oxide barrier 550 that is situated between the source and drain of the BETr transistor.

Figure 16:
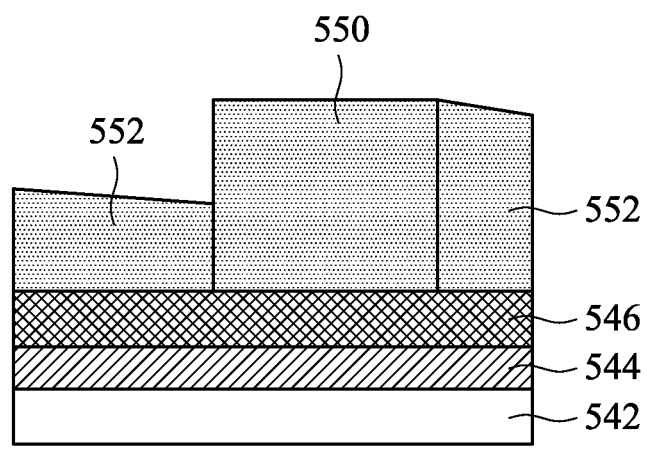
FIG. 16 is a diagram schematically illustrating generation of the oxide barrier, in accordance with some embodiments.

FIG. 16 is a diagram schematically illustrating generation of the oxide barrier 550, in accordance with some embodiments. The oxide 548 is etched at 552 in a BETr drain/source (D/S) photolithography and etching step. The result is the oxide barrier 550 situated on the BETr channel layer 546.

Figure 17:
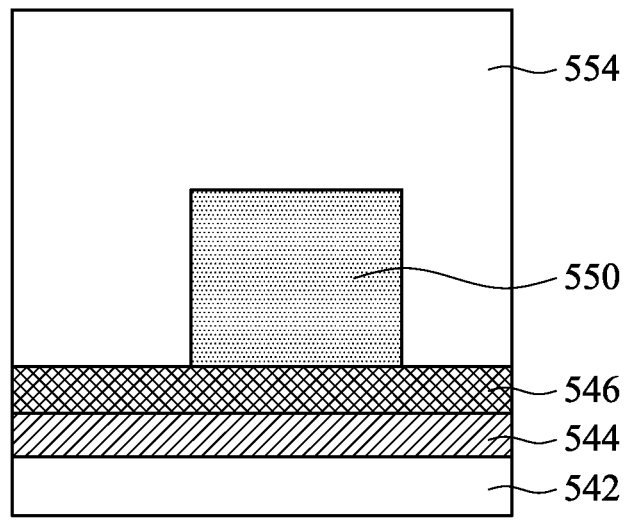
FIG. 17 is a diagram schematically illustrating metal deposited on the oxide barrier and on the BETr channel layer, in accordance with some embodiments.

FIG. 17 is a diagram schematically illustrating metal 554 deposited on the oxide barrier 550 and on the BETr channel layer 546, in accordance with some embodiments. The metal is deposited on the oxide barrier 550 and on the BETr channel layer 546 in a BETr D/S metal fill step.

Figure 18:
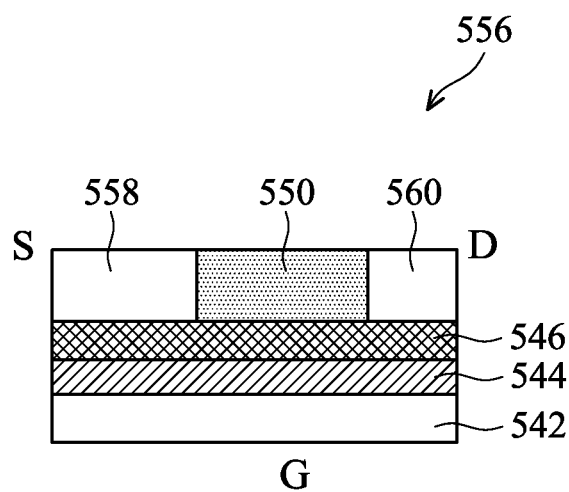
FIG. 18 is a diagram schematically illustrating a BETr transistor, in accordance with some embodiments.

FIG. 18 is a diagram schematically illustrating a BETr transistor 556, in accordance with some embodiments. The metal 554 and the oxide barrier 550 are partially removed in a BETr D/S chemical mechanical polishing (CMP) step. The resulting BETr transistor 556 includes a source contact S 558 and a drain contact D 560 on the BETr channel layer 546. The oxide barrier 550 is situated between the source contact S 558 and the drain contact D 560 to insulate the source contact S 558 from the drain contact D 560. Also, the BETr transistor 556 includes the gate contact 542 situated under the BETr interface layer 544.

Figure 19:
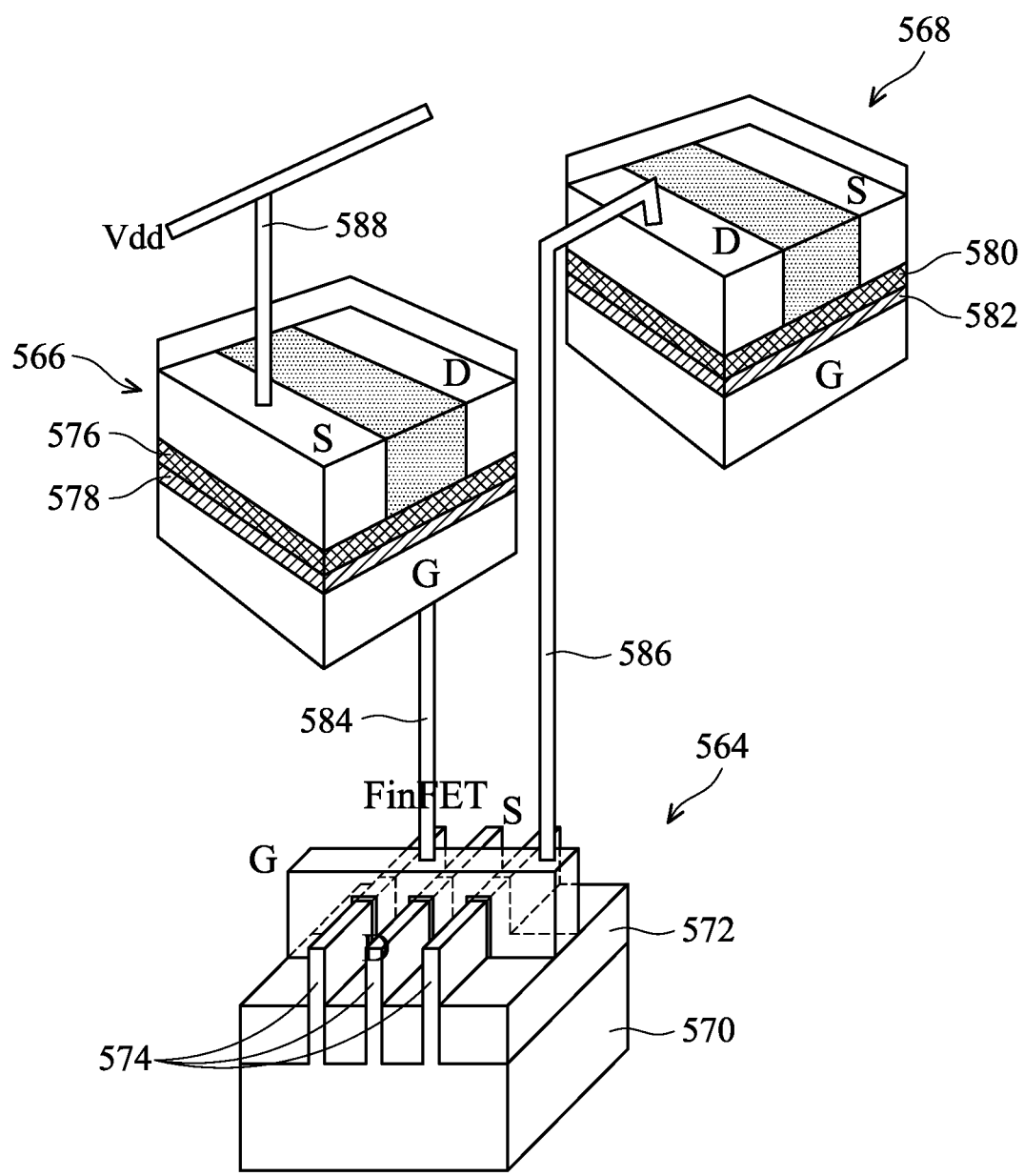
FIG. 19 is a diagram schematically illustrating a finFET transistor electrically connected to two BETr transistors, in accordance with some embodiments.

FIG. 19 is a diagram schematically illustrating a finFET transistor 564 electrically connected to two BETr transistors 566 and 568, in accordance with some embodiments. The finFet transistor 564 is formed on the lower layers of a device and the two BETr transistors 566 and 568 are formed on the upper layers of the device. The finFET transistor 564 is electrically connected to the two BETr transistors 566 and 568 during the process of manufacturing the finFET and BETr transistors, as described in relation to FIGS. 8-18. In some embodiments, the finFET transistors, such as the finFET transistor 564, are front-end-of-line (FEOL) devices and the BETr transistors, such as the BETr transistors 566 and 568, are BEOL devices. In some embodiments, the BETr transistors 566 and 568 are thin film transistors.

In some embodiments, the finFET transistor 564 is electrically connected to the two BETr transistors 566 and 568 to form part of the 6T SRAM cell 100 of FIG. 2. The finFet transistor 564 is formed on the lower layers 104, and the two BETr transistors 566 and 568 are formed on the upper layers 102. In some embodiments, the finFET transistor 564 is like the first PMOS PD transistor 114, the BETr transistor 566 is like the first NMOS PU transistor 106, and the BETr transistor 568 is like the second NMOS PU transistor 108.

The finFET transistor 564 includes a substrate 570, an oxide layer 572, and fins 574 that have source regions S and drain regions D. A gate G is formed over the fins 574 and the oxide layer 572. The BETr transistor 566 includes a source contact S and a drain contact D on a BETr channel layer 576 that is on a BETr interface layer 578 on a gate contact G. The BETr transistor 568 includes a source contact S and a drain contact D on a BETr channel layer 580 that is on a BETr interface layer 582 on a gate contact G.

The gate G of the finFET transistor 564 is electrically connected to the gate G of the BETr transistor 566 by contact 584, and to the drain contact D of the BETr transistor 568 by contact 586. Also, the source contact S of the BETr transistor 566 is electrically connected to a power line VDD by contact 588. These and other transistors are further electrically connected to manufacture memory cells and other devices.

Figure 20:
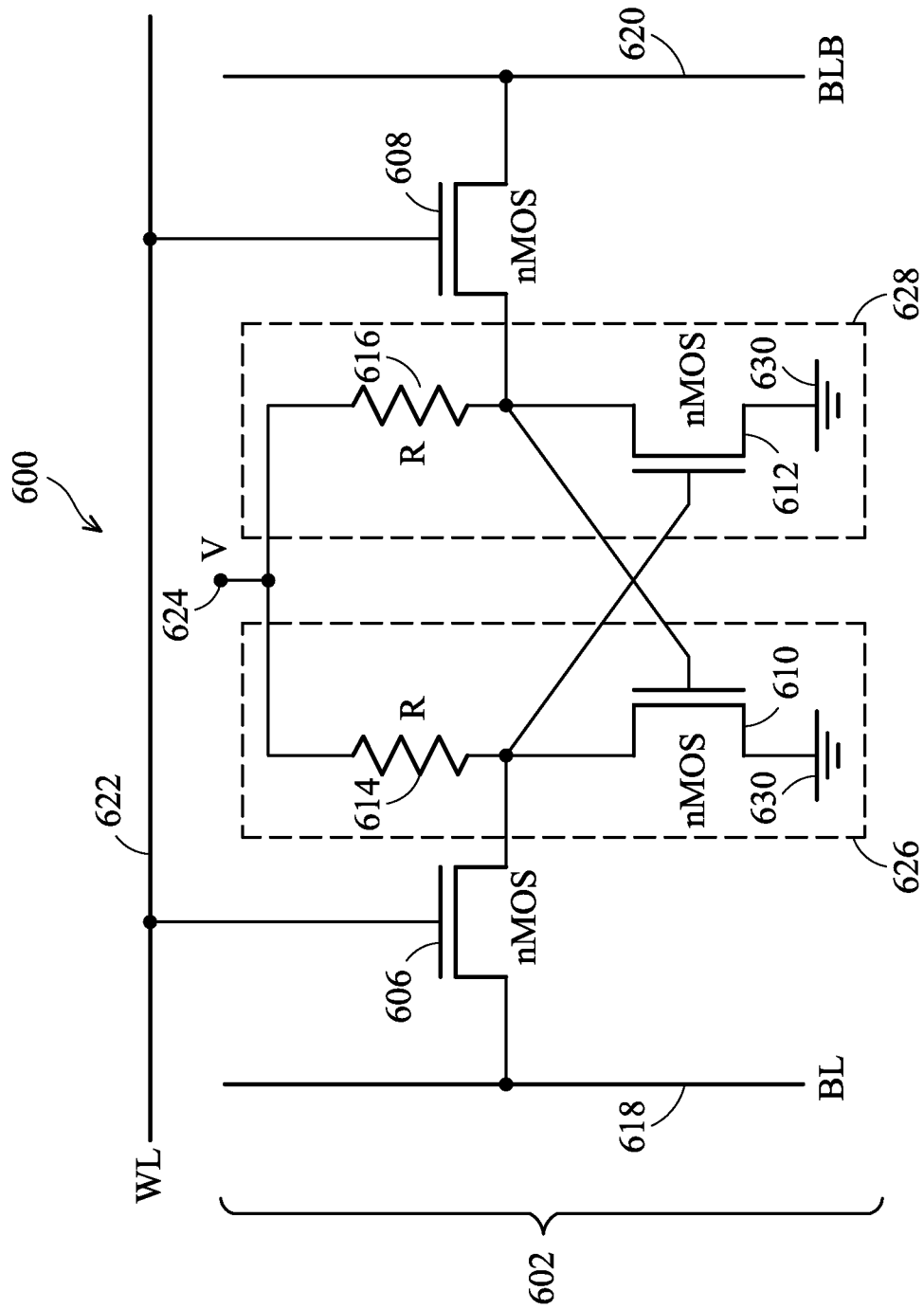
FIG. 20 is a diagram schematically illustrating a four transistor and two resistor (4T2R) SRAM cell, in accordance with some embodiments.

FIG. 20 is a diagram schematically illustrating a four transistor and two resistor (4T2R) SRAM cell 600, in accordance with some embodiments. The 4T2R SRAM cell 600 includes four BETr transistors and two BETr resistors formed on one or more upper layers 602. The 4T2R SRAM cell 600 is configured to be used in a memory device, such as the memory device 40 of FIG. 1. In some embodiments, the 4T2R SRAM cell 600 is like one of the memory cells 44. In other embodiments, the 4T2R SRAM cell 600 includes one or more finFET transistors formed on one or more lower layers and/or one or more resistors formed on one or more of the lower layers. In some embodiments, the 4T2R SRAM cell 600 includes all four transistors and both resistors formed on one or more lower layers.

The 4T2R SRAM cell 600 includes a first NMOS access control transistor 606, a second NMOS access control transistor 608, a first NMOS PD transistor 610, and a second NMOS PD transistor 612 formed on the one or more upper layers 602. The 4T2R SRAM cell 600 also includes a first BETr resistor 614 and a second BETr resistor 616 formed on the one or more upper layers 602. In some embodiments, the upper layers include metal layers, such as a metal-2 layer and/or a metal-3 layer and/or one or more higher metal layers.

The 4T2R SRAM cell 600 is electrically connected to a bit line BL 618 and a bit line bar BLB 620, like the bit line BL and bit line bar BLB of the memory device 40. Also, the 4T2R SRAM cell 600 is electrically connected to a word line WL 622, like the word line WL of the memory device 40. In addition, the 4T2R SRAM cell 600 is electrically connected to receive a power supply voltage V 624.

The 4T2R SRAM cell 600 includes the two NMOS access control transistors 606 and 608 and two cross-coupled inverters 626 and 628. The cross-coupled inverters 626 and 628 are configured to store one bit of information and the NMOS access control transistors 606 and 608 are configured to control access to the cross-coupled inverters 626 and 628.

The first cross-coupled inverter 626 includes the first BETr resistor 614 and the first NMOS PD transistor 610. One side of the first BETr resistor 614 is electrically connected to receive the power supply voltage V 624 and the other side of the first BETr resistor 614 is electrically connected to a drain/source region of the first NMOS PD transistor 610, the gate of the second NMOS PD transistor 612, and to a drain/source region of the first NMOS access control transistor 606. The other drain/source region of the first NMOS PD transistor 610 is electrically connected to a reference 630, such as ground.

The second cross-coupled inverter 628 includes the second BETr resistor 616 and the second NMOS PD transistor 612. One side of the second BETr resistor 616 is electrically connected to receive the power supply voltage V 624 and the other side of the second BETr resistor 616 is electrically connected to a drain/source region of the second NMOS PD transistor 612, the gate of the first NMOS PD transistor 610, and to a drain/source region of the second NMOS access control transistor 608. The other drain/source region of the second NMOS PD transistor 612 is electrically connected to the reference 630, such as ground.

The NMOS access control transistors 606 and 608 are connected to control access to the cross-coupled inverters 626 and 628 by selectively connecting the 4T2R SRAM cell 600 to the bit line BL 618 and to the bit line bar BLB 620. One drain/source region of the first NMOS access control transistor 606 is electrically connected to one side of the first BETr transistor 614, the drain/source region of the first NMOS PD transistor 610, and the gate of the second NMOS PD transistor 612. The other drain/source region of the first NMOS access control transistor 606 is electrically connected to the bit line BL 618. The gate of the first NMOS access control transistor 606 is electrically connected to the word line WL 622. Also, one drain/source region of the second NMOS access control transistor 608 is electrically connected to one side of the second BETr resistor 616, the drain/source region of the second NMOS PD transistor 612, and the gate of the first NMOS PD transistor 610. The other drain/source region of the second NMOS access control transistor 608 is electrically connected to the bit line bar BLB 620. The gate of the second NMOS access control transistor 608 is electrically connected to the word line WL 622.

In operation, a controller, such as the controller 48 (shown in FIG. 1), provides signals to the word line WL 622 to control access to the two cross-coupled inverters 626 and 628 by selectively connecting the 4T2R SRAM cell 600 to the bit line BL 618 and the bit line bar BLB 620.

In this example, the first and second NMOS access control transistors 606 and 608, the first and second NMOS PD transistors 610 and 612, and the first and second BETr resistors 614 and 616 are formed on the one or more upper layers 602. The first and second NMOS access control transistors 606 and 608 and the first and second NMOS PD transistors 610 and 612 are NMOS BETr transistors and the first and second BETr resistors 614 and 616 are BETr plate resistors.

In some embodiments, the first and second NMOS access control transistors 606 and 608 and the first and second NMOS PD transistors 610 and 612 are thin film transistors. In some embodiments, the BETr transistors and/or the BETr resistors include IGZO. In some embodiments, the BETr transistors and/or the BETr resistors include ITO. In other embodiments, the BETr transistors and/or the BETr resistors include other materials, such as other semiconductor oxide materials. The NMOS BETr transistors and/or the BETr resistors are fabricated in a BEOL process, which reduces the cost of fabricating the memory device and the cost of the memory device.

Figure 21:
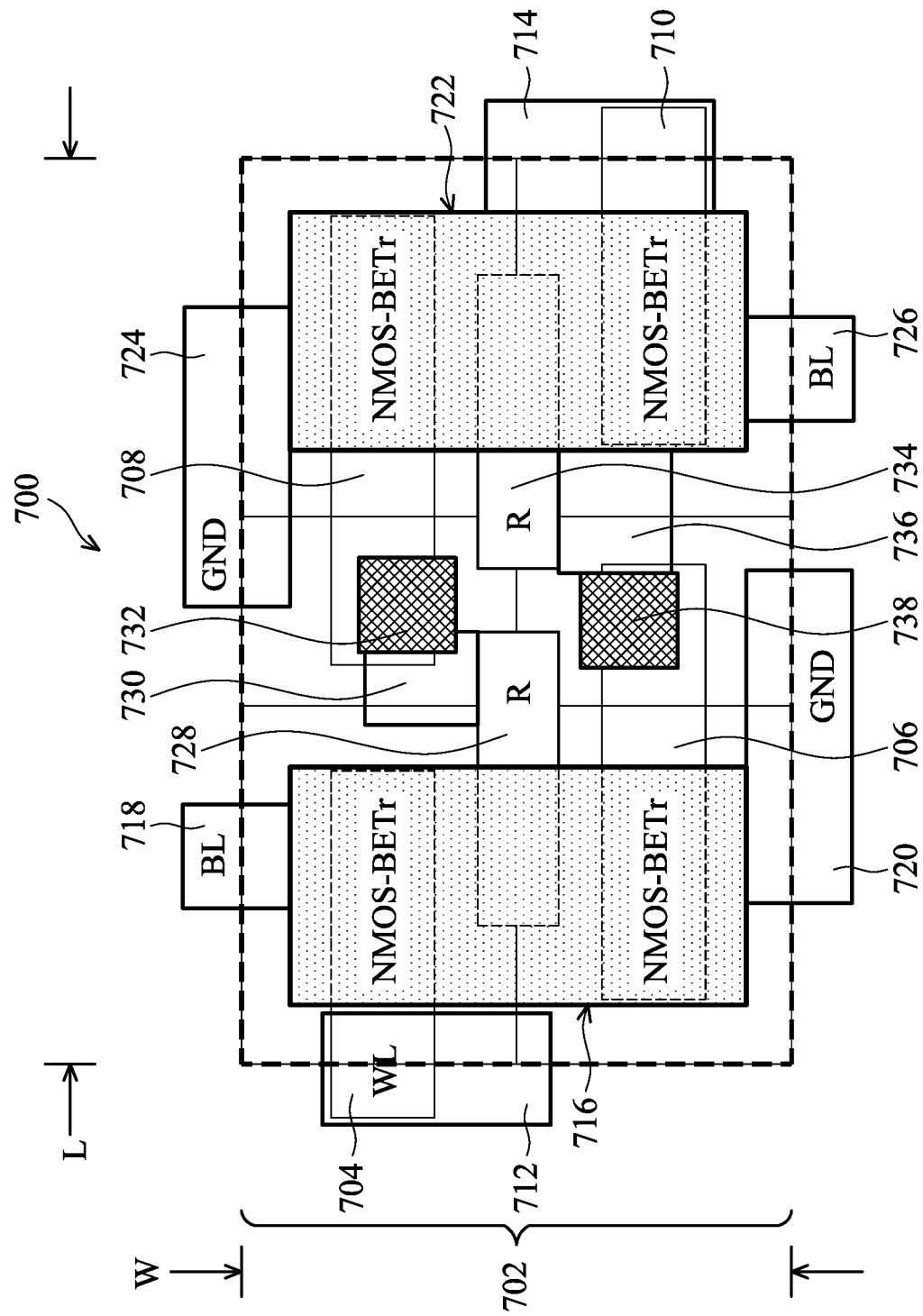
FIG. 21 is a diagram schematically illustrating a memory cell layout of the 4T2R SRAM cell of FIG. 20, in accordance with some embodiments.

FIG. 21 is a diagram schematically illustrating a memory cell layout 700 of the 4T2R SRAM cell 600 of FIG. 20, in accordance with some embodiments. The layout 700 includes upper layers 702, such that in some embodiments, the upper layers 702 are like the one or more upper layers 602 (shown in FIG. 20). In some embodiments, the length L is 5 F and the width W is 2 P.

The first NMOS access control transistor 606, the second NMOS access control transistor 608, the first NMOS PD transistor 610, the second NMOS PD transistor 612, the first BETr resistor 614, and the second BETr resistor 616 are formed on the one or more upper layers 702. In some embodiments, the upper layers 702 include metal layers, such as a metal-2 layer, a metal-3 layer, and/or one or more higher metal layers. In some embodiments, one or more of the first NMOS access control transistor 606, the second NMOS access control transistor 608, the first NMOS PD transistor 610, and the second NMOS PD transistor 612 are thin film transistors.

The upper layers 702 include a first gate structure 704 that is the gate of the first NMOS access control transistor 606, a second gate structure 706 that is the gate of the first NMOS PD transistor 610, a third gate structure 708 that is the gate of the second NMOS PD transistor 612, and a fourth gate structure 710 that is the gate of the second NMOS access control transistor 608. The first gate structure 704 is electrically connected to a word line WL by contact 712, and the fourth gate structure 710 is connected to the word line WL by contact 714.

A first semiconductor oxide structure (a BETr NMOS layer) 716 is disposed on the first gate structure 704 and on the second gate structure 706. The first semiconductor oxide structure 716 includes a first drain/source region, on one side of the first gate structure 704, that is connected to a bit line BL by contact 718, and a second drain/source region, on one side of the second gate structure 706, that is connected to a reference, such as ground, by contact 720.

A second semiconductor oxide structure (a BETr NMOS layer) 722 is disposed on the third gate structure 708 and on the fourth gate structure 710. The second semiconductor oxide structure 722 includes a first drain/source region, on one side of the third gate structure 708, that is connected to a reference, such as ground, by contact 724, and a second drain/source region, on one side of the fourth gate structure 710, that is connected to a bit line bar BLB by contact 726.

A first BETr plate 728 includes the first BETr resistor 614, where a portion of the BETr plate 728 that is not overlapped by a gate includes the first BETr resistor 614. The first BETr plate 728 is electrically connected on one side to the shared drain/source region of the first semiconductor oxide structure 716 that is situated between the first gate structure 704 and the second gate structure 706 and to the third gate structure 708 through contacts 730 and via 732. The other side of the first BETr plate 728 is electrically connected to a power line voltage Vdd.

A second BETr plate 734 is the second BETr resistor 616, where a portion of the BETr plate 734 that is not overlapped by a gate is the second BETr resistor 616. The second BETr plate 734 is electrically connected on one side to the shared drain/source region of the second semiconductor oxide structure 722 that is situated between the third gate structure 708 and the fourth gate structure 710 and to the second gate structure 706 through contacts 736 and via 738. The other side of the second BETr plate 734 is electrically connected to the power line voltage Vdd.

In some embodiments the upper layers 702 include metal layers, such as a metal-2 layer and/or a metal-3 layer. In some embodiments, the upper layers 702 include layers higher than the metal-2 layer and the metal-3 layer. In some embodiments, the upper layers 702 include a metal-4 layer, a metal-5 layer, and/or one or more higher upper layers. Additionally, in some embodiments, the BETr transistors and/or the BETr resistors are distributed across two or more layers. For example, one or more BETr transistors and/or BETr resistors can be disposed in a first layer, such as a metal-2 layer, and another one or more BETr transistors and/or BETr resistors can be disposed in a second layer that is positioned over the first layer, such as a metal-3 layer. In some embodiments, the BETr material is ceramic. In some embodiments, the BETr material is a ceramic that has a high resistance, such as in the millions of ohms.

Figure 22:
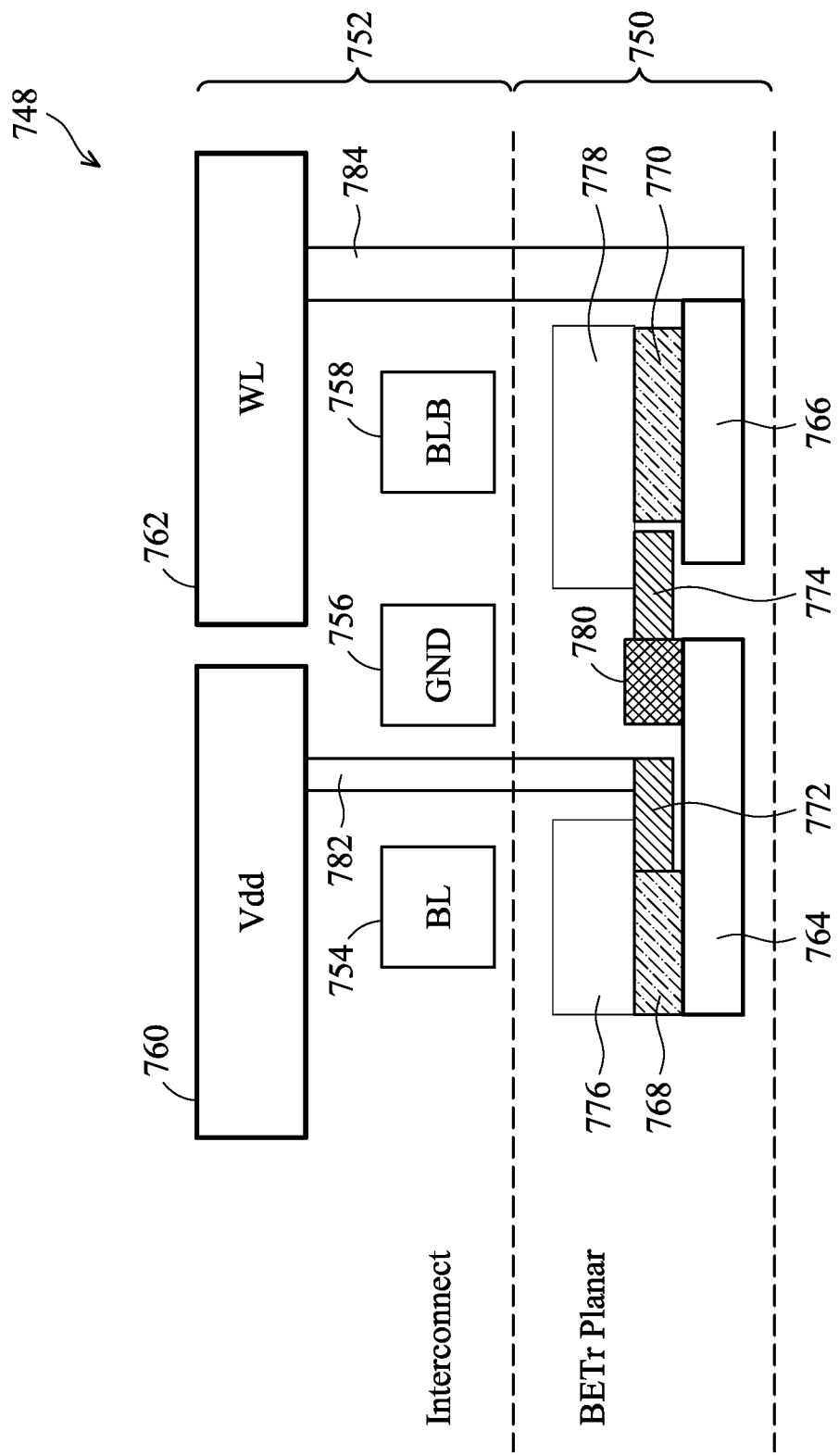
FIG. 22 is a diagram schematically illustrating a memory cell that includes upper layers and interconnect layers in cross-section, in accordance with some embodiments.

FIG. 22 is a diagram schematically illustrating a memory cell layout 748 that includes upper layers 750 and interconnect layers 752 in cross-section, in accordance with some embodiments. The upper layers 750 include the BETr planar transistors and the BETr resistors disposed in the same layers. The interconnect layers 752 are disposed over the upper layers 750. In some embodiments, the memory cell layout 748 is like the memory cell layout 700. In some embodiments, the upper layers 750 and the interconnect layers 752 are like the upper layers 702 and interconnect layers of the memory cell layout 700.

The interconnect layers 752 include a bit line BL 754, a ground line GND 756, a bit line bar BLB 758, a power line 760, and a word line WL 762. The power line 760, which carries power line voltage Vdd, and the word line WL 762 are disposed over the bit line BL 754, the ground line GND 756, and the bit line bar BLB 758.

The upper layers 750 include gate structures 764 and 766 that are like gate structures 704, 706, 708, and 710 (shown in FIG. 20), semiconductor oxide structures 768 and 770 that are like first and second semiconductor oxide structures 716 and 722 (shown in FIG. 20), BETr plates 772 and 774 that are like first and second BETr plates 728 and 734 (shown in FIG. 20), contacts 776 and 778 that are like contacts 712 and other contacts shown in FIG. 20, and via 780 that is like vias 732 and 738 (shown in FIG. 20).

In the upper layers 750, the semiconductor oxide structures 768 and 770 and the BETr plates 772 and 774 are disposed on the same layer and over the gate structures 764 and 766, respectively. Also, the contacts 776 and 778 are disposed over the semiconductor oxide structures 768 and 770 and the BETr plates 772 and 774, respectively. The via 780 extends from the gate structure 764 to the BETr plate 774, and vias 782 and 784 can be used to electrically connect a BETr plate, such as BETr plate 772, to the power line 760 and to electrically connect a gate structure, such as the gate structure 766, to the word line WL 762.

Figure 23:
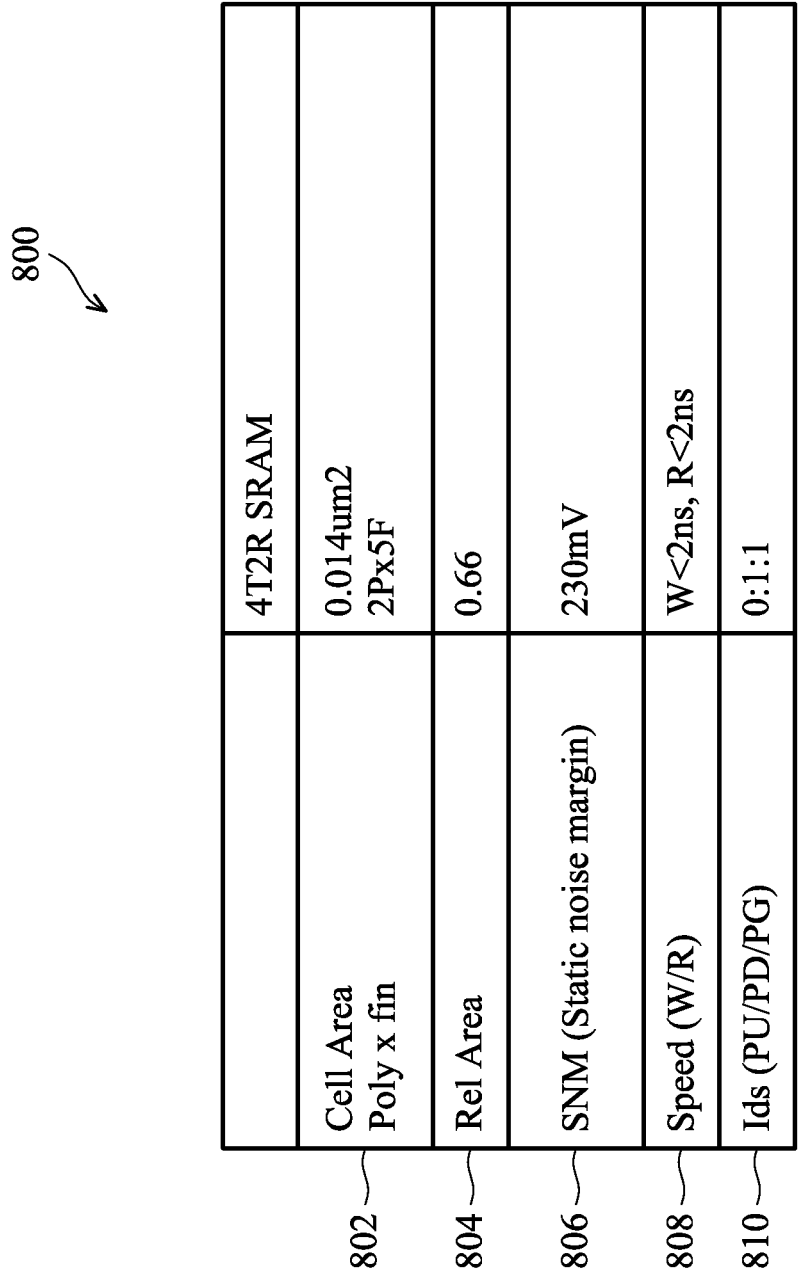
FIG. 23 is a diagram schematically illustrating a table that includes characteristics of the 4T2R SRAM cell of FIG. 20, in accordance with some embodiments.

FIG. 23 is a diagram schematically illustrating a table 800 that includes characteristics of the 4T2R SRAM cell 600 of FIG. 20, in accordance with some embodiments. The table 800 includes rows for cell area 802, relative cell area 804, SNM 806, speed 808 including write speed (W) and read speed (R), and Ids 810.

In some embodiments, at 802, the 4T2R SRAM cell 600 having the stacked layout of FIGS. 21 and 22 has a cell area of 0.014 μm², with a length of 5 F and a width of 2 P. The relative cell area at 804 of the stacked layout of FIGS. 21 and 22 is 0.66 times the cell area of a six transistor finFET SRAM cell on one layer.

Also, the 4T2R SRAM cell 600 has a SNM at 806 of 230 mV and, at 808, the 4T2R SRAM cell 600 has a write speed (W) of less than 2 ns and a read speed (R) of less than 2 ns, which compares favorably to a six transistor finFET SRAM cell on one layer. In addition, at 810, the BETr resistors do not have an Ids and the Ids through the PD transistors and the PG transistors are the same as the Ids through the PD transistors and the PG transistors of the six transistor SRAM cell on one layer.

Figure 24:
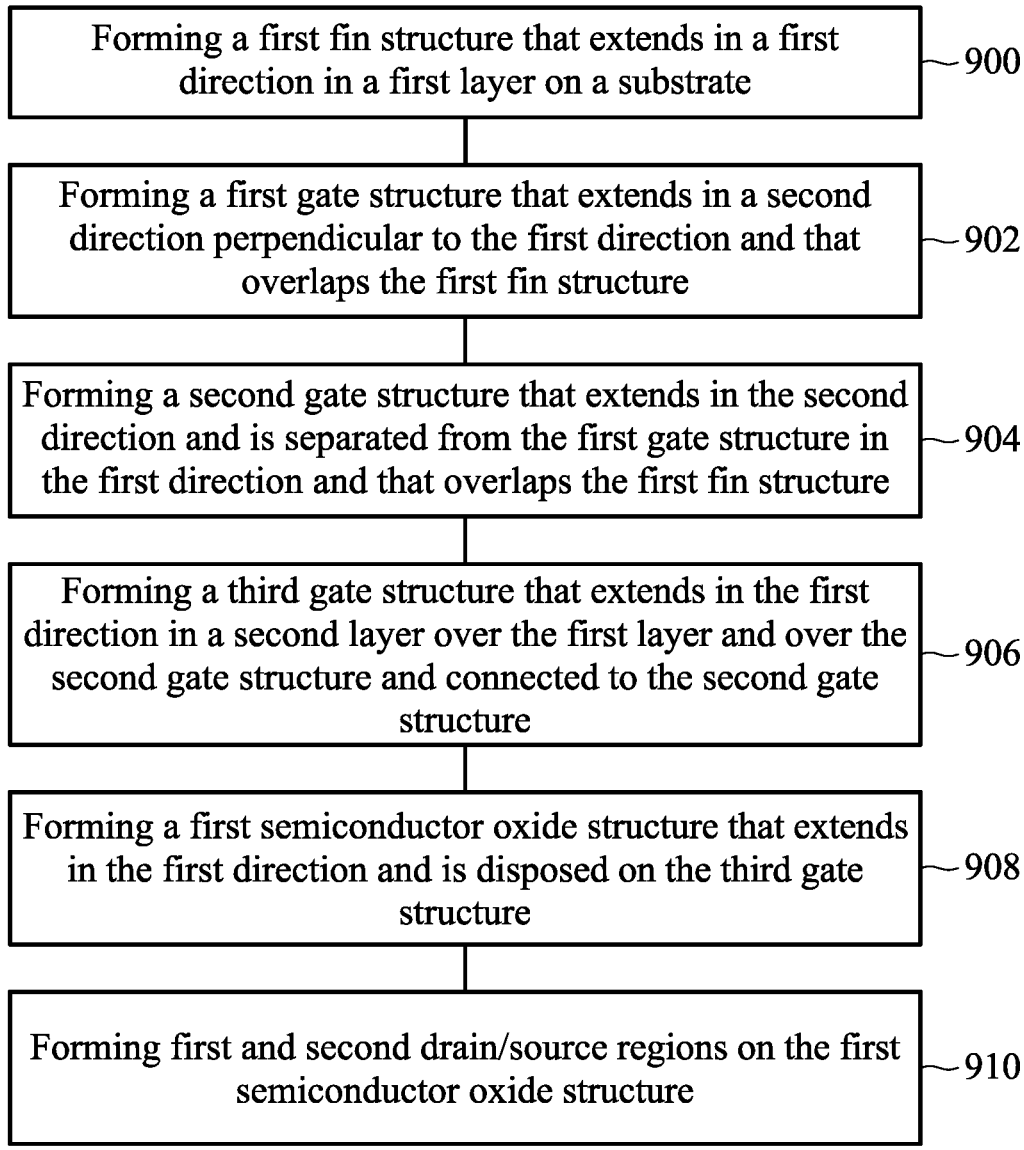
FIG. 24 is a diagram illustrating a method of manufacturing a memory device, in accordance with some embodiments.

FIG. 24 is a diagram illustrating a method of manufacturing a memory device, in accordance with some embodiments. The memory device includes multiple finFET transistors and one or more BETr transistors. In some embodiments, the BETr transistors include semiconductor oxide structures that include IGZO and/or ITO. In some embodiments, the finFET transistors are PMOS finFET transistors. In some embodiments, the finFET transistors are NMOS finFET transistors. In some embodiments, the BETr transistors are PMOS BETr transistors. In some embodiments, the BETr transistors are NMOS BETr transistors. In some embodiments, the memory device includes a 6T SRAM cell, such as the 6T SRAM cell of FIGS. 2-4.

At 900, the method includes forming a first fin structure that extends in a first direction in a first layer on a substrate. In some embodiments, the first fin structure is a fin structure for more than one finFET transistor.

At 902, the method includes forming a first gate structure that extends in a second direction perpendicular to the first direction and that overlaps the first fin structure and, at 904, the method includes forming a second gate structure that extends in the second direction and is separated from the first gate structure in the first direction and that overlaps the first fin structure. The first gate structure and the second gate structure are gates for separate finFET transistors.

At 906, the method includes forming a third gate structure that extends in the first direction in a second layer over the first layer and over the second gate structure and connected to the second gate structure. In some embodiments, the third gate structure is the gate of a planar BETr transistor formed on the second layer and electrically connected to the second gate structure.

At 908, the method includes forming a first semiconductor oxide structure that extends in the first direction and is disposed on the third gate structure and, at 910, the method includes forming first and second drain/source regions on the first semiconductor oxide structure. In some embodiments, the first semiconductor oxide structure including the first and second drain/source regions functions as channel material on the third gate structure for a planar BETr transistor.

In some embodiments, the method further includes forming a second fin structure that extends in the first direction in the first layer on the substrate and is separated from the first fin structure in the second direction. This second fin structure is a fin structure for two more finFET transistor, where the method further includes forming a fourth gate structure that extends in the second direction and overlaps the second fin structure, and forming a fifth gate structure that extends in the second direction and is separated from the fourth gate structure in the first direction and that overlaps the second fin structure.

In some embodiments, the method further includes one of the following: 1) forming a sixth gate structure that extends in the first direction in the second layer over the first layer and over the fourth gate structure and that is connected to the fourth gate structure; forming a second semiconductor oxide structure that extends in the first direction and is disposed on the sixth gate structure; and forming third and fourth drain/source regions on the second semiconductor oxide structure or 2) forming a sixth gate structure that extends in the first direction in a third layer over the second layer and over the fourth gate structure and that is connected to the fourth gate structure; forming a second semiconductor oxide structure that extends in the first direction and is disposed on the sixth gate structure; and forming third and fourth drain/source regions on the second semiconductor oxide structure.

Disclosed embodiments thus provide memory devices that include memory cells that have some transistors formed on one or more upper layers and some transistors formed on one or more lower layers of the memory device. For example, in some embodiments, a 6T SRAM cell includes two transistors formed on the one or more upper layers and four transistors formed on the one or more lower layers and, in some embodiments, a 6T SRAM cell includes four transistors formed on the one or more upper layers and two transistors formed on the one or more lower layers and, in some embodiments, a 4T2R SRAM cell includes four transistors and two resistors formed on the one or more upper layers. Thus, the amount of area consumed by the SRAM cells can be reduced from the area consumed by six transistors on one layer to the area consumed by four transistors on the one or more lower layers or four transistors on the one or more upper layers. Also, in some embodiments, the one or more transistors (and resistors) on the upper layers are fabricated in a BEOL process, which reduces the cost of fabricating the memory device and the cost of the memory device. In addition, in some embodiments, the speed of the disclosed memory cells is equal to or substantially equal to the speed of conventional one-layer memory cells.

In some embodiments, the transistors formed on the one or more upper layers are BETr transistors. In some embodiments, the transistors formed on the one or more upper layers are planar, thin film transistors. In some embodiments, the BETr transistors include IGZO. In some embodiments, the BETr transistors include ITO. In other embodiments, other semiconductor oxide materials are used.

Disclosed embodiments also include the 4T2R memory cell. In some embodiments, the 4T2R memory cell includes the four transistors and the two resistors formed in the one or more upper layers. In some embodiments, the 4T2R memory cell includes the four transistors and the two resistors formed in multiple layers, such as multiple upper layers. In some embodiments, the four transistors are NMOS BETr transistors, and the two resistors are BETr resistors. In some embodiments, the BETr resistors are part of a BETr plate, where a portion of the BETr plate that does not overlap with a gate of the BETr transistor is a resistor and not a transistor channel. In some embodiments, the BETr material is a ceramic material that has a high resistance. In some embodiments, the BETr material includes IGZO. In some embodiments, the BETr material includes ITO.

In accordance with some embodiments, a semiconductor device includes a substrate, a first layer over the substrate, and a second layer over the first layer. The first layer includes a first fin structure, a first gate structure that overlaps the first fin structure to form a first pass-gate transistor, and a second gate structure that is separate from the first gate structure and that overlaps the first fin structure to form a first PD transistor. The second layer includes a third gate structure disposed over the second gate structure and connected to the second gate structure, a first semiconductor oxide structure disposed on the third gate structure, and a first drain/source region and a second drain/source region disposed on the first semiconductor oxide structure, wherein the third gate structure, the first semiconductor oxide structure, the first drain/source region, and the second drain/source region constitute a first PU transistor.

In accordance with further embodiments, a semiconductor device includes pass gate transistors and a cross-coupled inverter. The pass gate transistors include a first transistor having a first gate and a first drain/source path and a second transistor having a second gate and a second drain/source path, wherein the first gate and the second gate are electrically connected to a word line. The cross-coupled inverter includes a third transistor having a third gate and a third drain/source path, a fourth transistor having a fourth gate and a fourth drain/source path, a first resistor electrically connected on a first side to power, and a second resistor electrically connected on a first side to power, wherein the third gate is electrically connected to the second and fourth drain/source paths and a second side of the second resistor, and the fourth gate is electrically coupled to the first and third drain/source paths and a second side of the first resistor to form the cross-coupled inverter.

In accordance with still further disclosed aspects, a method of manufacturing a memory device includes: forming a first fin structure that extends in a first direction in a first layer on a substrate; forming a first gate structure that extends in a second direction perpendicular to the first direction and that overlaps the first fin structure; forming a second gate structure that extends in the second direction and is separated from the first gate structure in the first direction and that overlaps the first fin structure; forming a third gate structure that extends in the first direction in a second layer over the first layer and over the second gate structure and connected to the second gate structure; forming a first semiconductor oxide structure that extends in the first direction and is disposed on the third gate structure; and forming first and second drain/source regions on the first semiconductor oxide structure.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first layer over the substrate, comprising:
      a first fin structure;
      a first gate structure that overlaps the first fin structure to form a first pass-gate transistor; and
      a second gate structure that is separate from the first gate structure and that overlaps the first fin structure to form a first pull-down transistor; and
   a second layer over the first layer, comprising:
      a third gate structure disposed over the second gate structure and connected to the second gate structure;
      a first semiconductor oxide structure disposed on the third gate structure; and
      a first drain/source region and a second drain/source region disposed on the first semiconductor oxide structure, wherein the third gate structure, the first semiconductor oxide structure, the first drain/source region, and the second drain/source region constitute a first pull-up transistor,
         wherein the first pass-gate transistor and the first pull-down transistor are p-type transistors, and the first pull-up transistor is an n-type transistor.

2. The semiconductor device of claim 1, wherein the first layer comprises:
   a second fin structure that is separate from the first fin structure;
   a fourth gate structure that overlaps the second fin structure to form a second pull-down transistor; and
   a fifth gate structure that is separate from the fourth gate structure and that overlaps the second fin structure to form a second pass-gate transistor.

3. The semiconductor device of claim 2, wherein the second layer comprises:
   a sixth gate structure that is disposed over the fourth gate structure and connected to the fourth gate structure;
   a second semiconductor oxide structure that is disposed on the sixth gate structure; and
   a third drain/source region and a fourth drain/source region disposed on the second semiconductor oxide structure, wherein the sixth gate structure, the second semiconductor oxide structure, the third drain/source region, and the fourth drain/source region constitute a second pull-up transistor.

4. The semiconductor device of claim 3, wherein the first pull-up transistor and the second pull-up transistor are situated in an area defined by a length and a width of the first pass-gate transistor, the first pull-down transistor, the second pass-gate transistor, and the second pull-down transistor.

5. The semiconductor device of claim 2, comprising a third layer over the second layer, the second layer comprising:
   a sixth gate structure that is disposed over the fourth gate structure and connected to the fourth gate structure;
   a second semiconductor oxide structure that is disposed on the sixth gate structure; and
   a third drain/source region and a fourth drain/source region disposed on the second semiconductor oxide structure, wherein the sixth gate structure, the second semiconductor oxide structure, the third drain/source region, and the fourth drain/source region constitute a second pull-up transistor.

6. The semiconductor device of claim 5, wherein the first pull-up transistor and the second pull-up transistor are situated in an area defined by a length and a width of the first pass-gate transistor, the first pull-down transistor, the second pass-gate transistor, and the second pull-down transistor.

7. The semiconductor device of claim 1, wherein the first semiconductor oxide structure includes indium gallium zinc oxide (IGZO) and/or indium tin oxide (ITO).

8. The semiconductor device of claim 1, comprising interconnect layers disposed over the second layer and including a word line connected to the first gate structure and a power line connected to the first drain/source region.

9. The semiconductor device of claim 1, comprising interconnect layers disposed over the second layer and including a bit line and a reference connected to the first fin structure.

10. A semiconductor device, comprising:
a substrate;
a first layer over the substrate, comprising:
  a first fin structure; and
  a first gate structure that overlaps the first fin structure to form a first p-type pull-down transistor; and
a second layer over the first layer, comprising:
  a second gate structure disposed over the first gate structure and connected to the first gate structure; and
  a first semiconductor oxide structure disposed on the second gate structure, wherein the second gate structure and the first semiconductor oxide structure form a first n-type pull-up transistor.

11. The semiconductor device of claim 10, wherein the first semiconductor oxide structure includes a first drain/source region and a second drain/source region disposed on the first semiconductor oxide structure, wherein the second gate structure, the first semiconductor oxide structure, the first drain/source region, and the second drain/source region form the first n-type pull-up transistor.

12. The semiconductor device of claim 10, wherein the first layer comprises:
a second fin structure that is separate from the first fin structure;
a third gate structure that overlaps the second fin structure to form a second p-type pull-down transistor; and
a fourth gate structure that is separate from the third gate structure and that overlaps the second fin structure to form a p-type pass-gate transistor.

13. The semiconductor device of claim 12, wherein the second layer comprises:
a fifth gate structure that is disposed over the third gate structure and connected to the third gate structure; and
a second semiconductor oxide structure that is disposed on the fifth gate structure, wherein the fifth gate structure and the second semiconductor oxide structure form a second n-type pull-up transistor.

14. The semiconductor device of claim 10, comprising:
a third gate structure that is separate from the first gate structure and that overlaps the first fin structure to form a p-type pass-gate transistor.

15. The semiconductor device of claim 10, wherein the first semiconductor oxide structure includes indium gallium zinc oxide (IGZO) and/or indium tin oxide (ITO).

16. A semiconductor device, comprising:
a substrate;
a first layer over the substrate, comprising:
  a first fin structure;
  a first gate structure that overlaps the first fin structure to form a first pass-gate transistor, wherein the first pass-gate transistor is a p-type transistor; and
  a second gate structure that is separate from the first gate structure and that overlaps the first fin structure to form a first pull-down transistor, wherein the first pull-down transistor is a p-type transistor; and
a second layer over the first layer, comprising:
  a third gate structure disposed over the second gate structure and connected to the second gate structure;
  a first semiconductor oxide structure disposed on the third gate structure, wherein the first semiconductor oxide structure includes indium gallium zinc oxide; and
  a first drain/source region and a second drain/source region disposed on the first semiconductor oxide structure, wherein the third gate structure, the first semiconductor oxide structure, the first drain/source region, and the second drain/source region form a first pull-up transistor that is an n-type transistor.

17. The semiconductor device of claim 16, wherein the first layer comprises:
a second fin structure that is separate from the first fin structure;
a fourth gate structure that overlaps the second fin structure to form a second pull-down transistor; and
a fifth gate structure that is separate from the fourth gate structure and that overlaps the second fin structure to form a second pass-gate transistor.

18. The semiconductor device of claim 17, wherein the second layer comprises:
a sixth gate structure that is disposed over the fourth gate structure and connected to the fourth gate structure;
a second semiconductor oxide structure that is disposed on the sixth gate structure; and
a third drain/source region and a fourth drain/source region disposed on the second semiconductor oxide structure, wherein the sixth gate structure, the second semiconductor oxide structure, the third drain/source region, and the fourth drain/source region form a second pull-up transistor.

19. The semiconductor device of claim 18, wherein the first pull-up transistor and the second pull-up transistor are situated in an area defined by a length and a width of the first pass-gate transistor, the first pull-down transistor, the second pass-gate transistor, and the second pull-down transistor.

20. The semiconductor device of claim 16, comprising interconnect layers disposed over the second layer and including a word line connected to the first gate structure, a power line connected to the first drain/source region, a bit line connected to the first fin structure, and a reference connected to the first fin structure.

* * * * *